United States Patent
Hermes et al.

(10) Patent No.: US 12,199,209 B2
(45) Date of Patent: Jan. 14, 2025

(54) OPTICAL SENSOR AND DETECTOR FOR AN OPTICAL DETECTION

(71) Applicant: trinamix GmbH, Ludwigshafen am Rhein (DE)

(72) Inventors: Wilfried Hermes, Ludwigshafen (DE); Sebastian Valouch, Ludwigshafen (DE); Sebastian Mueller, Ludwigshafen (DE); Regina Hoeh, Ludwigshafen (DE); Heidi Bechtel, Ludwigshafen (DE); Timo Altenbeck, Ludwigshafen (DE); Fabian Dittmann, Ludwigshafen (DE); Bertram Feuerstein, Ludwigshafen (DE); Thomas Hupfauer, Ludwigshafen (DE); Anke Handreck, Ludwigshafen (DE); Robert Gust, Ludwigshafen (DE); Robert Send, Karlsruhe (DE); Ingmar Bruder, Ludwigshafen (DE)

(73) Assignee: TRINAMIX GMBH, Ludwigshafen Am Rhein (DE)

( * ) Notice: Subject to any disclaimer, the term of this patent is extended or adjusted under 35 U.S.C. 154(b) by 741 days.

(21) Appl. No.: 17/422,245

(22) PCT Filed: Jan. 16, 2020

(86) PCT No.: PCT/EP2020/051017
§ 371 (c)(1),
(2) Date: Jul. 12, 2021

(87) PCT Pub. No.: WO2020/148381
PCT Pub. Date: Jul. 23, 2020

(65) Prior Publication Data
US 2022/0093811 A1    Mar. 24, 2022

(30) Foreign Application Priority Data

Jan. 18, 2019  (EP) .................... 19152511

(51) Int. Cl.
*H01L 31/09* (2006.01)
*H01L 31/0203* (2014.01)
*H01L 31/032* (2006.01)

(52) U.S. Cl.
CPC .......... *H01L 31/09* (2013.01); *H01L 31/0203* (2013.01); *H01L 31/0324* (2013.01)

(58) Field of Classification Search
None
See application file for complete search history.

(56) References Cited

U.S. PATENT DOCUMENTS

| 5,291,066 A | 3/1994 | Neugebauer et al. |
| 7,939,932 B2 | 5/2011 | Martin |
| (Continued) | | |

FOREIGN PATENT DOCUMENTS

| JP | H02219267 A | 8/1990 |
| WO | 2012110924 A1 | 8/2012 |
| (Continued) | | |

OTHER PUBLICATIONS

JP 3199430 B2, Semiconductor Element, Aug. 20, 2001 (Year: 2001).*

(Continued)

*Primary Examiner* — Alexander G Ghyka
(74) *Attorney, Agent, or Firm* — Armstrong Teasdale LLP

(57) ABSTRACT

Described herein is an optical sensor, a detector including the optical sensor for an optical detection of at least one object, a method for manufacturing the optical sensor and various uses of the optical detector.

The optical sensor can be supplied as a non-bulky hermetic package which provides an increased degree of protection against possible degradation by humidity and/or oxygen over long terms. Further, the optical sensor may be easily manufactured and integrated on a circuit carrier device.

12 Claims, 3 Drawing Sheets

(56) References Cited

U.S. PATENT DOCUMENTS

| | | | |
|---|---|---|---|
| 2009/0001254 A1* | 1/2009 | Ogawa | H01L 27/14676 |
| | | | 250/208.1 |
| 2013/0313604 A1 | 11/2013 | Engl et al. | |

FOREIGN PATENT DOCUMENTS

| | | | | |
|---|---|---|---|---|
| WO | 2014097181 | A1 | 6/2014 | |
| WO | 2015044529 | A1 | 4/2015 | |
| WO | WO-2016120392 | A1 * | 8/2016 | A63F 13/213 |
| WO | 2018019921 | A1 | 2/2018 | |
| WO | 2018193045 | A1 | 10/2018 | |

OTHER PUBLICATIONS

International Search Report for corresponding PCT/EP2020/051017 mailed May 8, 2020, 20 Pages.

Leskelä et al. "Preparation of lead sulfide thin films by the atomic layer epitaxy process." Vacuum (1990), 41(4-6), 1457-1459.

Dasgupta et al. "Fabrication and characterization of lead sulfide thin films by atomic layer deposition." ECS Transactions (2008), 16 (4), pp. 29-36.

Dasgupta et al. "Design of an atomic layer deposition reactor for hydrogen sulfide compatibility." Rev. Sc. Instr. (2010), 81, 044102, 6 pages.

Xu et al. "Atomic layer deposition of absorbing thin films on nanostructured electrodes for short-wavelength infrared photo-sensing." Appl. Phys. Lett. (2015), 107, 153105, 5 pages.

Blount et al. "Photoconductive properties of chemically deposited PbS with dielectric overcoatings." J. Appl. Phys. (1975), 46, pp. 3489-3499.

Groner et al. "Low-Temperature $Al_2O_3$ Atomic Layer Deposition." Chem. Mater. (2004), 16, pp. 639-645.

Yoon et al. "Electrical Measurement Under Atmospheric Conditions of PbSe Nanocrystal Thin Films Passivated by Remote Plasma Atomic Layer Deposition of $Al_2O_3$." IEEE Transaction Nanotech (2013), 12 (2), pp. 146-151.

Hu et al. "Air-stable short-wave infrared PbS colloidal quantum dot photoconductors passivated with $Al_2O_3$ atomic layer deposition." Appl. Phys. Lett. (2014), 105, 171110, 5 pages.

Liu et al. Robust, Functional Nanocrystal Solids by Infilling with Atomic Layer Deposition, Nano Letters (2011), 11(12), pp. 5349-5355.

Liu et al. "PbSe Quantum Dot Field-Effect Transistors with Air Stable Electron Mobilities above 7 cm2 V-1 s-1." Nano Letters (2013), 13(4), pp. 1578-1587.

https://en.wikipedia.org/wiki/Printed_circuit_board, 25 pages, date and author unknown, accessed Aug. 18, 2021.

https://en.wikipedia.org/wiki/List_of_integrated_circuit_packaging_types, 19 pages, date and author unknown, accessed Aug. 18, 2021.

George. "Atomic Layer Deposition: an Overview." Chem. Rev. (2010), 110, p. 111-131.

* cited by examiner

OPTICAL SENSOR AND DETECTOR FOR AN OPTICAL DETECTION

CROSS-REFERENCE TO RELATED APPLICATIONS

This application is a U.S. National Phase Application of International Patent Application No. PCT/EP2020/051017, filed Jan. 16, 2020, which claims priority to European Patent Application No. 19152511.2, filed Jan. 18, 2019, the entire contents of which are hereby incorporated by reference herein.

FIELD OF THE INVENTION

The invention relates to an optical sensor and to a detector comprising such an optical sensor for an optical detection, in particular of optical radiation, especially within the infrared spectral range, specifically with regard to sensing at least one of transmissivity, absorption, emission and reflectance, provided by at least one light beam, or for determining a position of at least one object, specifically with regard to a depth or both to the depth and a width of the at least one object. Further, the invention relates to a method for manufacturing the optical sensor and to various uses of the optical sensor and the detector. Such devices, methods and uses can be employed in various areas of security technology. However, further applications are possible.

PRIOR ART

Various detectors for optically detecting at least one object are known on the basis of optical sensors. WO 2012/110924 A1 discloses a detector comprising at least one optical sensor, wherein the optical sensor exhibits at least one sensor region. Herein, the optical sensor is designed to generate at least one sensor signal in a manner dependent on an illumination of the sensor region. According to the FIP effect as described therein, the sensor signal, given the same total power of the illumination, is hereby dependent on a geometry of the illumination, in particular on a beam cross-section of the illumination on the sensor region. The detector furthermore has at least one evaluation device designated to generate at least one item of geometrical information from the sensor signal, in particular at least one item of geometrical information about the illumination and/or the object.

WO 2014/097181 A1 discloses a method and a detector for determining a position of at least one object, by using at least one transversal optical sensor and at least one longitudinal optical sensor. Preferably, a stack of longitudinal optical sensors is employed, in particular to determine a longitudinal position of the object with a high degree of accuracy and without ambiguity. Further, WO 2014/097181 A1 discloses a human-machine interface, an entertainment device, a tracking system, and a camera, each comprising at least one such detector for determining a position of at least one object.

WO 2016/120392 A1 discloses further kinds of materials which are suitable as longitudinal optical sensor. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photo-conductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible. Further, a transversal optical sensor having a sensor area is disclosed, wherein the sensor area comprises a layer of the photo-conductive material, preferentially embedded in between two layers of a transparent conducting oxide, and at least two electrodes. Preferably, at least one of the electrodes is a split electrode having at least two partial electrodes, wherein transversal sensor signals provided by the partial electrodes indicate an x- and/or a y-position of the incident light beam within the sensor area.

M Leskelä, L Niinistö, P Niemela, E Nykänen, P Soininen, M Tiitta and J Vähäkangas, *Preparation of lead sulfide thin films by the atomic layer epitaxy process*, studied a preparation of lead sulfide thin films on different substrates by atomic layer deposition (ALD). Sulfur source was in all experiments H2S, but as lead source the following compounds were tested: bromide, iodide and acetate as well as thd (2,2,6,6-tetramethyl-3,5-heptanedione) and diethyldithiocarbamate chelates. The last complex gave the highest growth rate. The growth experiments were carried out at 300-350° C. and the film thicknesses varied between 0.1 and 1 μm. The results showed that the films were polycrystalline and randomly oriented. The conductivity was p-type and the carrier concentration and mobility were comparable with those found in films deposited by traditional chemical methods.

N. P. Dasgupta, S. P. Walch and F. B. Prinz, *Fabrication and characterization of lead sulfide thin films by atomic layer deposition*, ECS Transactions 16 (4), p. 29-36, 2008, present a study of the deposition of lead sulfide (PbS) thin films by ALD. PbS films were deposited from $Pb(tmhd)_2$ and $H_2S$ precursors at precursor sublimation temperatures of 165-175° C. The film growth rate was 0.13-0.18 nm/cycle, which is higher than previously published values. A linear growth rate characteristic of ALD was observed, with no chemical contamination. AFM images show that the films are polycrystalline with grain size increasing with film thickness.

N. P. Dasgupta, J. F. Mack, M. C. Langston, A I Bousetta, and F. B. Prinz, *Design of an atomic layer deposition reactor for hydrogen sulfide compatibility*, Rev. Sc. Instr. 81, 044102, 2010, describe a customized ALD reactor being designed with components compatible with hydrogen sulfide ($H_2S$) chemistry. $H_2S$ is used as a reactant for the ALD of metal sulfides. The use of $H_2S$ in an ALD reactor requires special attention to safety issues due to its highly toxic, flammable, and corrosive nature. The reactor was designed with respect to materials compatibility of all wetted components with $H_2S$. A customized safety interlock system was developed to shut down the system in the event of toxic gas leakage, power outage, loss of building ventilation or compressed air pressure. ALD of lead sulfide (PbS) and zinc sulfide (ZnS) were demonstrated with no chemical contamination or detectable release of $H_2S$.

J. Xu, B. R. Sutherland, S. Hoogland, F. Fan, S. Kinge, and E. H. Sargent, *Atomic layer deposition of absorbing thin films on nanostructured electrodes for short-wavelength infrared photo-sensing*, Appl. Phys. Lett. 107, 153105, 2015, report that ALD, prized for its high-quality thin-film formation in the absence of high temperature or high vacuum, has become an industry standard for the large-area deposition of a wide array of oxide materials. Recently, it has shown promise in the formation of nanocrystalline sulfide films. Here, they demonstrate the viability of ALD lead sulfide for photodetection. Leveraging the conformal capabilities of ALD, they enhance the absorption without compromising the extraction efficiency in the absorbing layer by utilizing a ZnO nanowire electrode. The nanowires are first coated with a thin shunt-preventing $TiO_2$ layer, followed by an infrared-active ALD PbS layer for photo-sensing.

In particular in order to avoid degradation of the photoconductive material by external influence, such as by humidity and/or oxygen, the optical sensor comprising the photoconductive material may at least partially be covered with an encapsulation layer. For this purpose, the encapsulation layer is, typically, provided by using an encapsulation glue, usually an epoxy-based glue, and/or an encapsulation glass. In addition or alternatively, the optical sensor may be encapsulated in hermetically sealed packages. However, encapsulation glass and encapsulation glue are, preferably, selected with respect to their absorption characteristic over the wavelength range which may be relevant for sensing by the photoconductive material. Herein, borosilicate glass and quartz glass are known to absorb at wavelengths above ca. 2500 nm, which may considerably limit a spectral response of the photoconductive material, in particular, of PbS and PbSe. Other encapsulation glasses, such as sapphire, may provide a more suitable absorption characteristic, but usually tend to be quite expensive. In addition, hermetic packages generally turn out to be rather bulky, difficult to integrate on printed circuit boards, and expensive.

G. H. Blount, K. Preis, R. T. Yamada, and R. H. Bube, *Photoconductive properties of chemically deposited PbS with dielectric overcoatings*, J. Appl. Phys. 46, p. 3489, 1975, describe overcoatings of $Al_2O_3$, $As_2S_3$, CdTe, $MgF_2$, SiO, and $SiO_2$ which were vacuum deposited on thin-film PbS photodetectors. Overcoating thicknesses were approximately those required to optimize antireflection properties. None of the overcoatings seriously degraded detector properties, although production yields were low with $Al_2O_3$, $MgF_2$, and CdTe. The low yields are apparently due to physical incompatibilities of the overcoating and the PbS film. Improved detector properties were obtained with $As_2S_3$ through a reduction of 1/f noise and passivation to hostile environments.

M. D. Groner, F. H. Fabreguette, J. W. Elam, and S. M. George, *Low-Temperature $Al_2O_3$ Atomic Layer Deposition*, Chem. Mater. 16, pp. 639-645, 2004, report about $Al_2O_3$ films deposited by ALD at temperatures as low as 33° C. in a viscous-flow reactor using alternating exposures of $Al(CH_3)_3$ (trimethylaluminum, TMA) and $H_2O$. Low-temperature $Al_2O_3$ ALD films have the potential to coat thermally fragile substrates such as organic, polymeric, or biological materials. $Al_2O_3$ film densities were lower at lower deposition temperatures. $Al_2O_3$ ALD film densities were 3.0 g/cm3 at 177° C. and 2.5 g/cm3 at 33° C. AFM images showed that $Al_2O_3$ ALD films grown at low temperatures were very smooth with a root-mean-squared (RMS) roughness of only 0.4±0.1 nm. Elemental analysis of the films using forward recoil spectrometry revealed hydrogen concentrations that increased with decreasing growth temperature. No other elements were observed by Rutherford backscattering spectrometry except the parent aluminum and oxygen concentrations. Low-temperature $Al_2O_3$ ALD at 58° C. was demonstrated for the first time on a poly(ethylene terephthalate) (PET) polymeric substrate.

U.S. Pat. No. 5,291,066 A discloses a moisture-proof integrated circuit module including at least one integrated circuit component in a high density interconnect (HDI) structure fabricated by applying to a substrate successive multiple ply sequences having a plurality of via holes therein. The sequences overlie the component(s) and the module substrate, and each sequence includes a dielectric film and a plurality of lands comprised of metal that extends into the vias of the sequence to provide electrical interconnections. The module includes at least one moisture barrier film to prevent penetration of moisture through the module to the circuit component(s).

U.S. Pat. No. 7,939,932 B2 discloses a low-temperature inorganic dielectric ALD film (e.g., $Al_2O_3$ and $TiO_2$) deposited on a packaged or unpackaged chip device so as to coat the device including any exposed electrical contacts. Such a low-temperature ALD film generally can be deposited without damaging the packaged chip device. The ALD film is typically deposited at a sufficient thickness to provide desired qualities (e.g., hermeticity for the entire packaged chip device, passivation for the electrical contacts, biocompatibility, etc.) but still allows for electrical connections to be made to the electrical contacts (e.g., by soldering or otherwise) directly through the ALD film without having to expose the electrical contacts.

W. Yoon, A. R. Smith, E. E. Foos, J. E. Boercker, W. B. Heuer, and J. G. Tischler, *Electrical Measurement Under Atmospheric Conditions of PbSe Nanocrystal Thin Films Passivated by Remote Plasma Atomic Layer Deposition of $Al_2O_3$*, IEEE Transaction Nanotech. 12 (2), pp. 146-151, 2013, report that PbSe nanocrystal thin-film transistors (TFTs) were passivated using remote plasma ALD of a ~10 nm thick $Al_2O_3$ film at 150° C. By using a highly reactive remote oxygen plasma source, the time for one complete ALD cycle was about 15 s with growth rates of ~0.11 nm/cycle. The effective mobilities measured under atmospheric condition from $Al_2O_3$-passivated PbSe nanocrystal TFTs were comparable to the values reported previously for air-free PbSe nanocrystal TFTs, demonstrating that ALD $Al_2O_3$ layers prevent oxidation and degradation of nanocrystal films from air exposure. The variation in the effective mobility of passivated devices was also found to be negligible under ambient conditions over a period of 30 days. The results show that remote plasma ALD processing of $Al_2O_3$ is capable of producing an effective passivation layer on air-sensitive nanocrystals with high deposition rates at reduced temperature.

C. Hu, A. Gassenq, Y. Justo, K. Devloo-Casier, H. Chen, C. Detavernier, Z. Hens, and G. Roelkens, *Air-stable shortwave infrared PbS colloidal quantum dot photoconductors passivated with $Al_2O_3$ atomic layer deposition*, Appl. Phys. Lett. 105, 171110, 2014, present a PbS colloidal quantum dot photoconductor with $Al_2O_3$ ALD passivation for airstable operation. Two different types of inorganic ligands for the quantum dots, $S^{2-}$ and $OH^-$, are investigated. PbS/$S^{2-}$ photoconductors with a cut-off wavelength up to 2.4 lm are obtained, and a responsivity up to 50 NW at 1550 nm is reported.

Y. Liu, M. Gibbs, C. L. Perkins, J. Tolentino, M. H. Zarghami, J. Bustamante Jr., and M. Law, *Robust, Functional Nanocrystal Solids by Infilling with Atomic Layer Deposition*, Nano Letters, Vol. 11, No. 12, 24 Oct. 2011, pp. 5349-55, describe optoelectronic devices which are based on films of lead chalcogenide, in particular PbSe, nanocrystals, wherein low-temperature ALD is used to fill in the PbSe nanocrystals with metal oxides, in particular amorphous alumina, in order to generate inorganic nanocomposites in which the nanocrystals are locked in place and protected against oxidative and photothermal damage.

Y. Liu, J. Tolentino, M. Gibbs, R. Ihly, C. L. Perkins, Y. Liu, N. Crawford, J. C. Hemminger, and M. Law, *PbSe Quantum Dot Field-Effect Transistors with Air Stable Electron Mobilities above 7 $cm^2$ $V^{-1}$ $s^{-1}$*, Nano Letters, Vol. 13, No. 4, 1 Mar. 2013, pp. 1578-87, describe films of lead chalcogenide, in particular PbSe, colloidal quantum dots, which are filled with metal oxides, in particular amorphous alumina, by low-temperature ALD in order to achieve high charge carrier mobility in FETs with simultaneous passivation of surface states by the ALD coating.

JP H02 219267 A discloses a photoelectric converter which is improved in moisture resistance by protruding side edges of a protective member from side edges of a sensor substrate and, at the same time, positioning side edges of the contact surface of a bonding agent layer with the protective member outside the side edges of the substrate. In particular, the width of a thin glass plate functioning as a protective member is made larger than the width of a sensor substrate and, at the same time, side edges of the glass plate are respectively protruded outward from side edges of the substrate. Then, a bonding agent layer is formed such that both side edges of the layer are more extruded outward as going higher, with the contact surface of the layer and with the glass plate being expanded to the side edges of the glass plate and the other contact surface with the substrate being expanded to the side faces of the substrate. Accordingly, the boundary between the layer and the glass plate is extended in the width direction, with the boundary between the layer and the substrate being extended similarly, and, at the same time, the width of the layer 29 itself being widened.

US 2013/313604 A1 discloses a method for producing a light-emitting semiconductor component. Herein, a light-emitting semiconductor chip is arranged on a mounting area of a carrier, wherein the chip is electrically connected to electrical contact regions on the mounting area. An encapsulation layer is applied to the chip using ALD. All surfaces of the chip which are free after mounting and electrical connection are covered with the encapsulation layer.

WO 2015/044529A1 discloses a component formed of a substrate, a semiconductor chip, such as an optoelectronic component, e.g. a light-emitting diode, an electrical contact wire, electrical contact layers, electrically conductive tracks, and a protective layer. Herein, the protective layer is optically transparent, has a thickness preferably below 100 nm and is made with ALD.

WO 2018/193045 A1 discloses a detector for optical detection comprising a circuit carrier designed to carry at least one layer, wherein the circuit carrier is or comprises a printed circuit board; a reflective layer, the reflective layer being placed on a partition of the circuit carrier, wherein the reflective layer is designed to reflect the incident light beam, thereby generating at least one reflected light beam; a substrate layer, the substrate layer being directly or indirectly adjacent to the reflective layer, wherein the substrate layer is at least partially transparent with respect to the incident light beam; a sensor layer, the sensor layer being placed on the substrate layer, wherein the sensor layer is designed to generate at least one sensor signal in a manner dependent on an illumination of the sensor layer by the incident light beam and the reflected light beam; and an evaluation device designed to generate at least one item of information by evaluating the sensor signal.

WO 2018/019921 A1 discloses an optical sensor comprising a layer of at least one photoconductive material, at least two individual electrical contacts contacting the layer of the photoconductive material, and a cover layer deposited on the layer of the photoconductive material, wherein the cover layer is an amorphous layer comprising at least one metal-containing compound. The optical sensor can be supplied as a non-bulky hermetic package which, nevertheless, provides a high degree of protection against possible degradation by humidity and/or oxygen. Moreover, the cover layer is capable of activating the photoconductive material which results in an increased performance of the optical sensor. Further, the optical sensor may be easily manufactured and integrated on a circuit carrier device.

Despite the advantages implied by the above-mentioned devices and detectors, there still is a need for improvements with respect to a simple, cost-efficient and, still, reliable optical sensor and spatial detector.

Problem Addressed by the Invention

Therefore, a problem addressed by the present invention is that of specifying a device and a method for an optical detection which at least substantially avoids the disadvantages of known devices and methods of this type.

In particular, providing an improved simple, cost-efficient and, still, reliable optical sensor and detector for detecting optical radiation, especially within the infrared spectral range, would be desirable, specifically with regard to sensing at least one of transmissivity, absorption, emission and reflectance.

Further, it would particularly be desirable to provide an improved simple, cost-efficient and, still, reliable optical sensor and detector for determining the position of an object in space, specifically with regard to a depth or both to the depth and a width of the at least one object, which, more specifically, may cover at least a partition of the infrared spectral range.

More particular, it would be desirable to be capable of furnishing the optical sensor with an encapsulation layer that may especially be improved for avoiding degradation by external influence, such as by humidity and/or oxygen, over a long term.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical sensor is disclosed. Herein, the optical sensor according to the present invention comprises a substrate attached to a circuit carrier device,
a layer of at least one photoconductive material which is directly or indirectly applied to the substrate,
at least two individual electrical contacts contacting the layer of the photoconductive material, and
a cover covering accessible surfaces of the layer of the photoconductive material and of the substrate, wherein the cover is an amorphous cover which comprises at least one metal-containing compound, wherein at least one of the substrate and the cover is optically transparent within a wavelength range.

As used herein, the "optical sensor" is generally a device which is designed to generate at least one sensor signal in a manner dependent on an illumination of a sensor region by a light beam. The sensor signal may generally be an arbitrary signal indicative of at least one of transmissivity, absorption, emission and reflectance of an incident light beam illuminating the sensor region, wherein the incident light beam may be provided by an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. Herein, a first coordinate may refer to a depth of an object which refers to a distance between the optical sensor and the object while two other coordinates which may be perpendicular to the first coordinate may refer to a width of the object. As an example, one or more Cartesian coordinate systems and/or other types of coordinate systems may be used. In one example, the coordinate system may be a coordinate system of the detector in which the detector has a predetermined position and/or orientation.

According to the present invention, the optical sensor comprises a layer of at least one photoconductive material, wherein the layer of the photoconductive material may function as a sensor region. As used herein, the "sensor region" is considered as a partition of the optical sensor being designed to receive the illumination of the optical sensor by the light beam, wherein the illumination in a manner as received by the sensor region may trigger the generation of the at least one sensor signal, wherein the generation of the sensor signal may be governed by a defined relationship between the sensor signal and the manner of the illumination of the sensor region.

As used herein, the term "photoconductive material" refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. In this kind of material, the electrical current may be guided via at least one first electrical contact through the material to at least one second electrical contact, wherein the first electrical contact is isolated from the second electrical contact while both the first electrical contact and the second electrical contact are in direct connection with the material. For this purpose, the direct connection may be provided by any known measure known from the state of the art, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

For the purposes of the present invention, the photoconductive material as used in the sensor region of the optical sensor may, preferably, comprise an inorganic photoconductive material, and/or a solid solution thereof and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary PbSe may be solved in PbS leading to $PbS_{1-x}Se_x$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide, which might, preferably, be selected from a group comprising sulfide chalcogenides, selenide chalcogenides, ternary chalcogenides, quaternary and higher chalcogenides. As generally used, the term "chalcogenide" refers to a compound which may comprise a group 16 element of the periodic table apart from an oxide, i.e. a sulfide, a selenide, and a telluride. Further, the term "chalcogenide" may also refer to mixed chalcogenides such as sulfoxides, sulfoselenides, selenidotellurides or the like. However, other inorganic photoconductive materials may equally be appropriate.

In a particularly preferred embodiment of the present invention, the optical sensor may be provided in a form of a layer of the at least one photoconductive material, which may comprise a sulfide chalcogenide, preferably lead sulfide (PbS), a selenide chalcogenide, preferably lead selenide (PbSe), a ternary chalcogenide, preferably lead sulfoselenide (PbSSe), or another appropriate material. Since at least the mentioned preferred photoconductive materials are, generally, known to exhibit a distinctive absorption characteristic within the infrared spectral range, the optical sensor having the layer which comprises the mentioned preferred photoconductive material may, preferably, be used as an infrared sensor. However, other embodiments and/or other photoconductive materials, in particular the photoconductive materials as disclosed in WO 2018/019921 A1 may also be feasible.

With regard to the mentioned photoconductive materials, layers of those materials which may comprise at least a few crystals exhibiting a size above 15 nm are included. Herein, the layer of the photoconductive material may be fabricated by applying at least one deposition method which may be selected from the group consisting of: vacuum evaporation, sputtering, atomic layer deposition, chemical vapor deposition, spray pyrolysis, electrodeposition, anodization, electro-conversion, electro-less dip growth, successive ionic adsorption and reaction, chemical bath deposition, and solution-gas interface techniques. As a result, the layer of the photoconductive material may exhibit a thickness of 10 nm to 100 μm, preferably of 100 nm to 10 μm, more preferred of 300 nm to 5 μm. However other photoconductive materials as mentioned above and/or below may also be feasible for this purpose and may also be treated in the same or in a similar fashion.

Preferably, the photoconductive material may be fabricated by depositing the respective material on an insulating substrate, preferably on a substrate as described below in more detail, in particular for providing mechanical stability to the layer of the photoconductive material. In this manner, by depositing the selected layer on the appropriate substrate and providing at least two individual electrical contacts, the optical sensor according to the present invention can, thus, be obtained. Herein, an illumination of the photoconductive material in the sensor region by an incident light beam results in a variation of the electrical conductivity in the illuminated layer of the photoconductive material. In a particular embodiment, the substrate may be or comprise an electrically conducting substrate, wherein an additional insulating interlayer may be present between the electrically conducting substrate and the at least one layer of the photoconductive material.

In a particularly preferred embodiment, the substrate may be directly or indirectly applied to a circuit carrier device, such as a printed circuit board (PCB). Herein, the term "printed circuit board", which is usually abbreviated to "PCB", refers to an electrically non-conductive, planar board, on which at least one sheet of an electrically conductive material, in particular a copper layer, is applied to, specifically laminated, onto the board. Other terms which refer to this type of circuit carrier which, in addition, comprises one or more electronical, electrical, and/or optical elements may also be denoted as a printed circuit assembly, short "PCA", a printed circuit board assembly, short "PCB assembly" or "PCBA", circuit card assembly or short "CCA" or simply "card". In the PCB, the board may comprise a glass epoxy, wherein a cotton paper impregnated with a phenolic resin, typically tan or brown, may also be sued as the board material. Depending on a number of sheets, the printed circuit board may be a single-sided PCB, a two-layer or double-sided PCB, or a multi-layer PCB, wherein different sheets are connected with each other by using so-called "vias". For the purposes of the present invention, an application of a single-sided PCB may be sufficient; however other kinds of printed circuit boards may also be applicable. A double-sided PCB may have metal on both sides while a multi-layer PCB may be designed by sandwiching additional metal layers between further layers of insulating material. In a multi-layer PCB, the layers can be laminated together in an alternating manner, wherein each metal layer may be individually etched and wherein internal vias may be plated through before the multiple layers are laminated together. Further, the vias may be or comprise copper-plated holes which can, preferably, be designed as electrically conducting paths through the insulating board.

The substrate which carries the layer of the photoconductive material, the corresponding electrical contacts, and, if applicable, further layers may be placed onto the circuit carrier device, such as the PCB, specifically by gluing, soldering, welding, or otherwise depositing it directly or indirectly on an adjacent surface of the circuit carrier device. By way of example, the substrate may be attached to the circuit carrier device, such as the PCB, by a thin film of glue placed between adjacent surfaces of the substrate and of the circuit carrier device, such as the PCB. For further embodiments of the printed circuit board, reference may be made to https://en.wikipedia.org/wiki/Printed_circuit_board. Alternatively, other kinds of circuit carriers may, however, also be applicable.

Consequently, upon impingement of the sensor region by the light beam the at least two electrical contacts may provide the sensor signal which depends on the electrical conductivity of the photoconductive material. The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space. Herein, the light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

The at least two individual electrical contacts may be applied at different locations of the layer of the photoconductive material, especially, in a manner that at least two of the individual electrical contacts are electrically isolated with respect to each other. Herein, the electrical contacts may comprise an evaporated metal layer which may easily be provided by known evaporation techniques. In particular, the evaporated metal layer may comprise one or more of gold, silver, aluminum, platinum, magnesium, chromium, or titanium. Alternatively, the electrical contacts may comprise a layer of graphene.

According to the present invention, the optical sensor further comprises a cover which covers an accessible surface of both the photoconductive material and the substrate. As generally used, the phrase "accessible surface" refers to a portion of a body, specifically of the layer of the photoconductive material and of the substrate, which can be reached by an atmosphere surrounding the optical sensor. Preferably, the cover may be applied in a manner that it may directly contact a top and sides of a layer of the photoconductive material and at least the sides of the substrate. As already indicated above, the substrate carries the layer of the photoconductive material, such that the top of the layer of the photoconductive material refers to an extended surface of the layer of the photoconductive material which is neither directly nor indirectly applied to the substrate. As generally used, the term "layer" refers to an elongated body which comprises two extended surfaces between which sides are arranged. Since both the photoconductive material and the substrate are provided as a layer, they comprise sides, respectively. For details concerning the top and the sides of the layer of the photoconductive material and the sides of the substrate, reference may be made to the figures below.

In a preferred embodiment, the cover may fully cover the accessible surface of both the layer of the photoconductive material and of the sides of the substrate, in particular in a preferred arrangement in which the substrate is attached to a circuit carrier device, such as a PCB, specifically in a manner as described above. In this preferred embodiment, the cover may be a continuous coating which continuously covers both the layer of the photoconductive material and of the sides of the substrate. As a result, the cover may coat all accessible surfaces of both the photoconductive material and of the substrate, thus preventing a direct contact between the material of the photoconductive layer or of the substrate with a surrounding atmosphere, thereby avoiding a degradation of the photoconductive material by external influence, such as humidity and/or oxygen. Compared to the cover layer as disclosed in WO 2018/019921 A1 which is only deposited on the layer of the photoconductive material apart from an area at which the cover layer meets the substrate where the preferably conformal cover layer necessarily touches the substrate at a negligible part of its surface, the cover according to the present invention significantly improves the long-term stability of the optical sensor. As a result, the cover according to the present invention improves a reduction or exclusion of external influences by additionally minimizing or diminishing an effect of humidity and/or oxygen onto the layer of the photoconductive material, especially by blocking and/or obstructing paths that may be capable of transferring humidity and/or oxygen through or along the surface of the substrate to the layer of the photoconductive material.

Thus, the cover according to the present invention may be adapted for providing an improved encapsulation for the photoconductive material. As used herein, the term "encapsulation" may refer to a package, preferably, an hermetic package, especially, in order to avoid as far as possible a partial or full degradation of the optical sensor or a partition thereof, in particular of the photoconductive material comprised within the sensor region of the optical sensor, by external influence, such as by humidity and/or by oxygen comprised in a surrounding atmosphere. Herein, the package may, preferably, be adapted to cover all accessible surfaces of the photoconductive material, wherein it may be taken into account that the layer of the photoconductive material may be deposited on a substrate which may already be adapted to protect a partition of the surfaces of the photoconductive material. In other words, the substrate and the cover may be adapted in a fashion that they can cooperate in order to accomplish an improved packaging, preferably an improved hermetic packaging, of the photoconductive material.

Preferably, at least one deposition method may be used for depositing the cover. For this purpose, the at least one deposition method may, in particular, be selected from an atomic layer deposition, a chemical vapor deposition, a sputtering process, or a combination thereof.

Consequently, the cover may, in a particularly preferred embodiment, be or comprise an atomic deposition coating, a chemical vapor deposition coating, a sputtered coating, or a coating generated by using at least two of the mentioned deposition methods, wherein the atomic deposition coating or a coating generated by using a combination of atomic deposition and sputtering may especially by preferred. In other words, the cover may, in this particularly preferred embodiment, be obtainable by an ALD process, a CVD process, a sputtering process, or a combination thereof, the ALD process or the combination of ALD and sputtering being especially preferred. Herein, the term "atomic layer deposition", the equivalent terms "atomic layer epitaxy" or "molecular layer deposition" as well as their respective abbreviations "ALD, "ALE" or "MLD" are, generally, used for referring to a deposition process which may comprise a self-limiting process step and a subsequent self-limiting reaction step. Hence, the process which is applied in accordance with the present invention may also be referred to as an "ALD process". For further details referring to the ALD process, reference may be made to by George, Chem. Rev., 110, p. 111-131, 2010. Further, the term "chemical vapor deposition", usually abbreviated to "CVD" refers to a method in which a surface of a substrate or a layer located on a substrate may be exposed to at least one volatile precursor, wherein the precursor may react and/or decompose on the surface in order to generate a desired deposit. In a frequent case, possible by-products may be removed by applying a gas flow above the surface. Further, the term "sputtering" refers to a process in which a solid target material is used for ejecting particles in consequence of an impact of the target by high energetic particles. Further, the combination of the ALD process and the sputtering process, may allow, firstly, sputtering a coarse phase comprising coarse particles on the surface of the photoconductive material and, subsequently, generating a fine phase by using ALD which may, especially, be adapted for filling spaces, gaps and/or pores between the coarse particles, whereby a thicker cover may, eventually, be provided within a shorter period of time. On the other hand, firstly performing the ALD process and, subsequently, performing the sputtering process would, firstly, allow a conformal coating, in particular a filling of the porous photoconductive layer, with the slow ALD process, especially, in order to protect the photoconductive layer from the subsequent sputter process which might be more damaging to the material surface and, subsequently, providing thick layers within a short period of process time. For further details concerning a preferred manufacturing process for providing the cover, reference may be made to the description of the method elsewhere in this document.

In further accordance with the present invention, the cover comprises at least one metal-containing compound. Herein, the metal-containing compound may, preferably, comprise a metal, wherein the metal may, in particular, be selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, and Bi. In a specific embodiment, the metal-containing compound may, alternatively, comprise a semimetal, which may also be denominated as a "metalloid", wherein the semimetal may be selected from the group consisting of B, Si, Ge, As, Sb, and Te. Preferably, the at least one metal-containing compound may be selected from the group consisting of Al, Ti, Ta, Mn, Mo, Zr, Hf, and W.

Herein, the at least one metal-containing compound may, preferably, be selected from the group comprising an oxide, a hydroxide, a chalcogenide, a pnictide, a carbide, or a combination thereof. As already defined above, the term "chalcogenide" refers to a compound which may comprise a group 16 element of the periodic table apart from an oxide, i.e. a sulfide, a selenide, and a telluride. In a similar fashion, the term "pnictide" refers to a, preferably binary, compound which may comprise a group 15 element of the periodic table, i.e. a nitride, a phosphide, arsenide and an antimonide. As described below in more detail, the metal-containing compound may, preferably, comprise at least one oxide, at least one hydroxide, or a combination thereof, preferably of Al, Ti, Zr or Hf; or, also preferred, a nitride of Si. In a particularly preferred embodiment of the present invention, the metal-containing compound as comprised by the cover may be a composition comprising aluminum oxide and/or aluminum hydroxide, which is, as generally used, for sake of simplicity also referred to as $Al_2O_3$.

In a particular embodiment, the cover may comprise at least two individual portions differing in their respective composition in a manner that adjacent portions may comprise a different metal-containing compound, each providing an amorphous structure. By way of example, the cover may comprise alternating adjacent portions of an Al-containing compound and of a Zr- or Hf-containing compound. However, other combinations of metal-containing compounds may also be possible. In addition, the laminate may further comprise additional portions which may rather be or comprise at least one of a metallic compound, a polymeric compound, a silicone compound, or a glass compound. Herein, other kinds of materials may also be feasible. Further, the laminate may also comprise additional portions which may, alternatively, also be crystalline or nanocrystalline.

In a particularly preferred embodiment of the present invention, the cover may exhibit a thickness of 10 nm to 600 nm, preferably of 20 nm to 200 nm, more preferred of 40 nm to 120 nm, most preferred of 50 to 95 nm. This thickness may, particularly, reflect the amount of metal-containing compounds within the cover that may be advantageous to achieve the above-mentioned functions of providing encapsulation for the photoconductive material.

In a further particularly preferred embodiment of the present invention, the cover may be conformal with respect to an adjacent surface of the photoconductive material or of the substrate. As defined above, the thickness of the conformal cover may, thus, follow the corresponding surface of the photoconductive material or of the substrate within a deviation of ±50 nm, preferably of ±20 nm, mostly preferred of ±10 nm, wherein the deviation may occur over at least for at least 90%, preferably for at least 95%, mostly preferred for at least 99%, of a surface of the cover, hereby leaving aside any contamination or imperfection that may be present on the surface of the cover.

As mentioned above, the layer of the photoconductive material may be directly or indirectly applied to at least one substrate. As generally used, the term "substrate" refers to an elongated body which is adapted for carrying a layer of a material, specifically of the photoconductive material as used herein in particular for providing mechanical stability to the layer of the photoconductive material. Further, the term "directly" refers to an immediate attachment of the layer of the photoconductive material to the substrate whereas the term "indirectly" refers to an attachment of the layer of the photoconductive material to the substrate via at least one intermediate layer, such as a bonding layer. Preferably, the substrate may be provided as a layer having lateral extensions which exceed a thickness of the layer by a factor of at least 5, preferably of at least 25, more preferred of at least 100. In particular, the thickness of the substrate may be of 10 µm to 2000 µm, preferably of 50 µm to 1000 µm, more preferred of 100 µm to 500 µm.

At least one of the substrate and the cover is optically transparent within a selected wavelength range. Consequently, it may, particularly, be advantageous to select the metal-containing compound used for the cover to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the metal-containing compound which may not to be optically transparent within the desired wavelength range as along as the substrate may exhibit sufficient transparency. For this purpose, the substrate may, in particular, comprise at least one at least partially transparent insulating material, wherein the insulating material may, preferably, be selected from the group comprising an at least partially glass, metal oxide, a ceramic material, or a doped variant thereof. Herein, the insulating material may, especially, be selected from at least one transparent glass, weakly doped semiconductor, metal oxide or ceramic material, in particular from sapphire ($Al_2O_3$), glass, quartz, fused silica, silicon, germanium, ZnS, or ZnSe. Alternatively the substrates may comprise materials with at least partially optically transparent properties. The insulator material may, especially, be selected from or in addition, the cover may, thus, also be selected to exhibit at least partially optically transparent properties. On the other hand, in case the substrate may already be at least partially transparent, a larger variety of different materials, including optically in transparent materials, can be employed for the cover.

As mentioned above, the layer of the photoconductive material may be directly or indirectly applied to at least one substrate, wherein at least one of the substrate and the cover is optically transparent within a selected wavelength range. Consequently, it may, particularly, be advantageous to select the metal-containing compound used for the cover to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the metal-containing compound which may not to be optically transparent within the desired wavelength range as along as the substrate may exhibit sufficient transparency. Herein, the substrate material may, especially, be selected from at least one of a transparent glass, silicon, germanium, a metal oxide, a metal or a semiconducting material, in particular from aluminum doped tin oxide (AZO), indium doped tin oxide (ITO), ZnS, or ZnSe, wherein glass or silicon are particularly preferred. For semiconducting or conductive layers, that may exhibit too high conductivity to serve as a good insulating substrate, an insulating interlayer optically transparent within the desired wavelength range may be employed.

Further, the cover may, concurrently, exhibit a further functionality in addition to the above-mentioned functions of providing encapsulation for the photoconductive material. In this regard, the metal-containing compound may, especially, be selected to be able to, concurrently, exert the desired further function. In particular, the metal-containing compound used for the cover may exhibit a high refractive index, preferably at least 1.2, more preferred at least 1.5, in order to qualify as a suitable anti-reflective material. As mentioned above, the cover may, particularly, be provided by using ALD or a combination of ALD and sputtering, in a conformal manner, such that the cover may tightly follow the surface of the photoconductive material. In particular, a PbS layer or a PbSe layer as the photoconductive layer, usually, exhibits not a smooth surface but a rather rough surface having protrusions and depressions, while $Al_2O_3$ was found as capable of being deposited as a cover which may tightly follow the surface of the PbS layer or the PbSe layer. As a result, reflections due to incoming light may, thus, be minimized. This observation appears to be in contrast to known deposition methods in which the deposited material is, usually, grown via coalescence which only allows minimizing the protrusions and depressions which may be present at the surface of the layer of the photoconductive material. Further, the cover may exhibit a further functionality, in particular, be selected from scratch-resistance, hydrophilicity, hydrophobicity, self-cleaning, anti-fog, and electrical conductivity. Other types of functions may also be possible, in particular, high-permittivity, preferably by using $Al_2O_3$ or $ZrO_2$, which may be employed for generating a high dielectric strength, especially, by using a high electric field, such as by applying a high electric voltage, across the optical sensor. Especially for the purpose of the selected functionality, the cover may, in addition, comprise one or more additives, such as one or more stabilizing agents, which may be added in order to accomplish the desired further function of the cover. In particular, the cover may comprise glass or glass particles as stabilizing agent. However, other kinds of additives may also be feasible.

In a particular embodiment, particularly in a case in which it might not be appropriate to provide the cover with the desired further function or in which an extent of the further function as provided by the selected cover may not be sufficient, the cover may, additionally, at least partially be covered by at least one additional layer at least partially deposited on the cover. As an alternative or in addition, the at least one additional layer may at least partially be deposited between the layer of the photoconductive material and the cover. Preferably, the additional layer may be or exhibit the further function and may, thus, comprise at least one of an anti-reflective layer, an optical filter layer, a scratch-resistant layer, a hydrophilic layer, a hydrophobic layer, a self-cleaning layer, an anti-fog layer, a high-permittivity layer, or a conductive layer. Herein, the person skilled in the art may be easily capable of selecting and providing the at least one additional layer. However, other embodiments may also be possible.

In a particularly preferred embodiment, the cover may partially or fully cover the electrical contacts, which may, especially, be configured to be bondable, such as to one or more leads to an external circuit. Herein, the electrical contacts may be bondable by using wires, such as gold or aluminum wires, wherein the electrical contacts may, preferably, be bondable through the cover. In a particular embodiment, an adhesive layer may be provided at the electrical contacts, wherein the adhesive layer may, especially, be adapted for bonding. For this purpose, the adhesive layer may comprise at least one of Ni, Cr, Ti or Pd.

In a further aspect of the present invention, a detector for optical detection, in particular of optical radiation, especially within the infrared spectral range, specifically with regard to sensing at least one of transmissivity, absorption, emission and reflectance, provided by at least one light beam, or for determining a position of at least one object, specifically with regard to a depth or to both the depth and a width of the at least one object, is disclosed. According to the present invention, the detector for an optical detection of at least one object comprises:

at least one optical sensor as described elsewhere herein, the optical sensor comprising at least one sensor region, wherein the optical sensor is designed to generate at least one sensor signal in a manner dependent on an illumination of the sensor region by a light beam; and at least one evaluation device, wherein the evaluation device is designed to generate at least one item of information with respect to optical radiation provided by the light beam by evaluating the sensor signal of the optical sensor.

Herein, the listed components may be separate components. Alternatively, two or more of the components may be integrated into one component. Further, the at least one evaluation device may be formed as a separate evaluation device independent from a transfer device, preferably selected from at least one of an optical lens, a mirror, a beam splitter, an optical filter, and the optical sensors, but may preferably be connected to the optical sensors in order to receive the sensor signal. Alternatively, the at least one evaluation device may fully or partially be integrated into the optical sensors.

According to the present invention, the detector comprises at least one of the optical sensors as described elsewhere in this document. Thus, the detector may, preferably, be designed for detecting electromagnetic radiation over a considerably wide spectral range, wherein the infrared (IR) spectral range may particularly be preferred. Herein, indium gallium arsenide (InGaAs) may especially, be selected for the photoconductive layer within the sensor region of the optical sensor for wavelengths up to 2.6 μm, indium arsenide (InAs) for wavelengths up to 3.1 μm, lead sulfide (PbS) for wavelengths up to 3.5 μm, lead selenide (PbSe) for wavelengths up to 5 μm, indium antimonide (InSb) for wavelengths up to 5.5 μm; and mercury cadmium telluride (MCT, HgCdTe) for wavelengths up 16 μm.

As used herein, the term "evaluation device" generally refers to an arbitrary device designed to generate the items of information, i.e. the at least one item of information with regard to sensing at least one of transmissivity, absorption, emission and reflectance, or of at least one object or for determining a position of at least one object, specifically with regard to a depth or both to the depth and a width of the at least one object. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. As used herein, the sensor signal may generally refer to one of the longitudinal sensor signal and, if applicable, to the transversal sensor signal. Further, the evaluation device may comprise one or more data storage devices. Further, as outlined above, the evaluation device may comprise one or more interfaces, such as one or more wireless interfaces and/or one or more wire-bound interfaces.

For further information with respect to the detector for optical detection or any components thereof, specifically the evaluation device, reference may be made to WO 2014/097181 A1 and WO 2018/019921 A1.

In a further aspect of the present invention, a method for manufacturing an optical sensor is disclosed. The method preferably may be used for manufacturing or producing at least one optical sensor according to the present invention, such as of at least one optical sensor according to one or more of the embodiments disclosed elsewhere in this document in further detail below. Thus, for optional embodiments of the method, reference might be made to the description of the various embodiments of the optical sensor.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method according to the present invention comprises the following steps:
  a) providing a substrate attached to a circuit carrier device, a layer of at least one photoconductive material which is directly or indirectly applied to the substrate, and at least two individual electrical contacts contacting the layer of the photoconductive material; and
  b) thereafter, depositing an amorphous cover on accessible surfaces of the layer of the photoconductive material and of the substrate, wherein the cover comprises at least one metal-containing compound, wherein at least one of the substrate and the cover is optically transparent within a wavelength range.

According to step a), a substrate, a layer of at least one photoconductive material and individual electrical contacts are provided. In particular, the respective materials for the substrate, the photoconductive layer and the electrical contacts may be selected from a list of the corresponding materials as presented above.

According to step b), the cover may be generated by using at least one of the methods as described above. Herein, step b) may be repeated at least once, preferably at least 10 times, more preferred at least 100 times. In a special embodiment, at least two adjacent cover portions may be deposited in form of a laminate. Herein, the term "laminate" may refer to a manner of deposition in which the adjacent portions may differ with respect to their respective composition. Consequently, the adjacent portions may differ in a fashion that they may comprise different metal-containing compounds. Alternatively, other kinds of compounds, in particular at least one of a metallic compound, a polymeric compound, a silicone compound, a glass compound, may be employed in some but not in all of the adjacent portions, such as in an alternating fashion with the layers comprising the metal-containing compounds. Preferably, the at least one metal-containing compound and, if applicable, the other kinds of compounds are deposited until it accomplishes a thickness of 10 nm to 600 nm, preferably of 20 nm to 200 nm, more preferred of 40 nm to 100 nm, most preferred of 50 to 95 nm. Herein, the at least one metal-containing compound and, if applicable, the other kinds of compounds are deposited in a manner that the cover may, preferably, be conformal with respect to an adjacent surface of the photoconductive material or of the substrate. Accordingly, the thickness of the conformal cover may follow a corresponding surface of the photoconductive material or of the substrate within a deviation of ±50 nm, preferably of ±20 nm, mostly preferred of ±10 nm, over at least 90%, preferably at least 95%, most preferred at least 99%, of a surface of the conformal cover.

In a particularly preferred embodiment of the present invention, at least one deposition method is used for depositing the metal-containing compound. Preferably, the deposition method may be selected from at least one of an atomic layer deposition (ALD) process, a chemical vapor deposition (CVD) process, a sputtering process, or a combination thereof. For further details with respect to the ALD process or the CVD process reference may be made to the description above. For the purpose of providing the metal-containing compound, two different types of precursors may, preferably, be employed, wherein a first precursor may be or comprise a metal-organic precursor, and wherein a second precursor may be or comprise a fluid. As generally used, the term "fluid" may refer to a non-solid state of the second precursor. By way of example, for providing an Al-containing compound, the first precursor may be or comprise TMA, i.e. trimethylaluminium $Al(CH_3)_3$, while the second precursor may be or comprise $H_2O$, oxygen, air or a solution thereof, or ozone. Alternatively or in addition, for providing a Zr-containing compound the first precursor may be or comprise TDMA-Zr, i.e. tetrakis(dimethylamido) zirconium (IV), while the second precursor may be or comprise $H_2O$, a solution thereof, or ozone. Herein, at least one of the precursors may be mixed with an inert gas, in particular $N_2$ or Ar, especially in order to provide a steady fluid flow.

As already described above, at least one additional layer may, further, be deposited on the cover or a partition thereof. As an alternative or in addition, at least one additional layer may at least partially be deposited on the layer of the photoconductive material and, subsequently, be coated by the cover. Herein, the additional layer may be selected to be or comprise at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

As mentioned above, the desired optical sensor is, generally, designed to generate at least one sensor signal in a manner dependent on an illumination of a sensor region as comprised by the optical sensor by an incident light beam. For this purpose, at least two electrical contacts being adapted to electrically contact the photoconductive material comprised within the sensor region are further provided. In general, the electrical contacts may be provided before or during any one of the method steps a) or b). In a particularly preferred embodiment, the electrical contacts may be provided before step b), such as by providing an evaporated metal layer, such as by known evaporation techniques, wherein the metal layer may, particularly, comprise one or more of silver, aluminum, platinum, magnesium, chromium, titanium, gold, or graphene. Alternatively, the electrical contacts may be provided by a galvanic or chemically deposition process, such as electroless Ni, electroless Au, galvanic Ni, or galvanic Au. Herein, the cover may be deposited in a manner that it may also fully or partially cover the electrical contacts. In this particular embodiment, the electrical contacts are at least partially, preferably fully, covered by the cover may, thus, be bonded to at least one external connection by using electrically conductive leads, preferably in form of wires, in particular Au, Al, or Cu wires, wherein the electrically conductive leads may, especially, be bonded to the electrical contacts through the cover. By way of example, Au contacts coated by the cover may, subsequently, be contacted by wire bonds.

In a particularly preferred embodiment, the layer of the photoconductive material may comprise at least two individual sensor areas, preferably an array of individual sensor areas, which are directly or indirectly applied to the same substrate, also denoted as "common substrate", which may, thus, exhibit a considerably large area. In this embodiment, the individual sensor areas are, in accordance with step a), firstly directly or indirectly applied to the common substrate, wherein at least two individual electrical contacts are provided as contacts for each of the individual sensor areas within the layer of the photoconductive material. Thereafter, the individual sensor areas are separated from each other in a fashion that each of the individual sensor areas is carried by a respective portion of the substrate. Finally, the cover is deposited according to step b) on the accessible surfaces of each of the individual sensor areas and of the respective portion of the substrate.

In addition, further details concerning the manufacturing process for the optical sensor may be found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, pMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAP-BGA, UCSP, pBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at
    https://en.wikipedia.org/wiki/List_of_integrated_circuit_
      packaging_types or
    https://en.wikipedia.org/wiki/List_of_integrated_circuit_
      package_dimensions.

In a further aspect of the present invention, a use of a detector according to the present invention is disclosed. Therein, a use of the detector for a purpose of use is selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a security application. In particular, the detector may be used for infra-red detection applications, heat-detection applications, thermometer applications, heat-seeking applications, flame-detection applications, fire-detection applications, smoke-detection applications, temperature sensing applications, spectroscopy applications, or the like. Further, the detector may be used to monitor exhaust gas, to monitor combustion processes, to monitor industrial processes, to monitor chemical processes, to monitor food processing processes, or the like. Further, the detector may be used for temperature control, motion control, exhaust control, gas sensing, gas analytics, motion sensing, chemical sensing, or the like. For further uses of the optical sensor and the detector as disclosed herein, reference may be made to WO 2016/120392 A1 and WO 2018/019921 A1. However, further fields of applications may still be conceivable.

The above-described optical sensor and the detector, the method, and the proposed uses have considerable advantages over the prior art. Thus, the optical sensor according to the present invention may be particularly sensitive over at least a partition of the IR spectral range, thus providing efficient, reliable and large-area position sensitive devices for the infrared spectral range. As compared to devices known in the art, the optical sensor as proposed herein which can, preferably, be supplied as a non-bulky hermetic package, nevertheless, provides an improved degree of protection over long terms against possible degradation by external influence, such as humidity and/or oxygen, even at elevated temperatures and humidity. Herein, the materials used for the optical sensor may be selected in order to ensure that the optical sensor may exhibit a suitable absorption characteristic over a wide spectral range. By way of example, the cover which comprises the material $Al_2O_3$ may be transparent for light beams with a wavelength up to 5 μm. Other materials may be used for other desired absorption characteristics over other spectral ranges. Moreover, since various materials exhibit a refractive index above 1.3, such as $Al_2O_3$ with approx. 1.75, the respective selected cover may, concurrently, exhibit a anti-reflective functionality. As mentioned above, this type of cover material may be capable of forming a smooth cover which may tightly follow the surface of the photoconductive material and of the substrate in a conformal manner.

Further, the optical sensor can be simply manufactured and easily be integrated into a package. Herein, manufacturing the cover according to the present invention, in particular, by using the process of atomic layer deposition (ALD) or the combination of ALD and sputtering, leak-free encapsulation may be provided, especially by filling pin-holes and porous structures in the layer of the photoconductive material as well as by blocking and/or obstructing paths that may be capable of transferring humidity and/or oxygen through or along the surface of the substrate to the layer of the photoconductive material. In this regard it may be mentioned that the ALD process or the combination of ALD and sputtering is, in general, a batch process which may be applied to a large plurality of samples within a single batch. Furthermore, the bondability of the electrical contacts even through the cover and the non-bulky hermetic package of the optical sensor allows easy integration on circuit carrier device, such as printed circuit boards (PCBs). In an alternative embodiment, the encapsulated photoconductive layer may be contacted by using through glass vias, which may allow a direct, hermetic connection from the top of the substrate to the bottom. In a particularly preferred embodiment, the substrate could be glued or soldered directly onto the circuit carrier device, such as the PCB.

Summarizing, in the context of the present invention, the following embodiments are regarded as particularly preferred:

Embodiment 1: An optical sensor, comprising a substrate, a layer of at least one photoconductive material which is directly or indirectly applied to the substrate, at least two individual electrical contacts contacting the layer of the photoconductive material, and a cover covering accessible surfaces of the photoconductive material and of the substrate, wherein the cover is an amorphous cover which comprises at least one metal-containing compound.

Embodiment 2: The optical sensor according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Si, Ge, As, Sb, and Te.

Embodiment 3: The optical sensor according to the preceding embodiment, wherein the at least one metal-containing compound comprises a metal selected from the group consisting of Al, Ti, Ta, Mn, Mo, Zr, Hf, and W.

Embodiment 4: The optical sensor according to any one of the preceding embodiments, wherein the at least one metal-containing compound is selected from the group comprising an oxide, a hydroxide, a chalcogenide, a pnictide, a carbide, or a combination thereof.

Embodiment 5: The optical sensor according to the preceding embodiment, wherein the at least one metal-containing compound comprises at least one oxide, at least one hydroxide, or a combination thereof of Al, Ti, Zr or Hf; or a nitride of Si.

Embodiment 6: The optical sensor according to any one of the preceding embodiments, wherein the cover directly contacts a top and sides of the layer of the photoconductive material and at least the sides of the substrate.

Embodiment 7: The optical sensor according to any one of the preceding embodiments, wherein the cover fully covers the accessible surface of both the layer of the photoconductive material and of the sides of the substrate.

Embodiment 8: The optical sensor according to the preceding embodiment, wherein the cover is a continuous coating which continuously covers both the layer of the photoconductive material and of the sides of the substrate.

Embodiment 9: The optical sensor according to the preceding embodiment, wherein the cover is further adapted to function as an anti-reflective layer.

Embodiment 10: The optical sensor according to any one of the preceding embodiments, wherein the cover is or comprises a laminate having at least two adjacent portions, wherein the adjacent portions differ by their respective composition, wherein at least one of the adjacent portions comprises the at least one metal-containing compound.

Embodiment 11: The optical sensor according to the preceding embodiment, wherein at least one of the adjacent portions comprises at least one of a metallic compound, a polymeric compound, a silicone compound, a glass compound.

Embodiment 12: The optical sensor according to any one of the preceding embodiments, wherein the cover has a thickness of 10 nm to 600 nm, preferably of 20 nm to 200 nm, more preferred of 40 nm to 120 nm, most preferred of 50 to 95 nm.

Embodiment 13: The optical sensor according to any one of the preceding embodiments, wherein the cover is a conformal cover with respect to an adjacent surface of the layer of the photoconductive material and of the substrate, Embodiment 14: The optical sensor according to the preceding embodiment, wherein the thickness of the conformal cover follows a corresponding surface of the photoconductive material and of the substrate within a deviation of ±50 nm, preferably of ±20 nm, mostly preferred of ±10 nm, over at least 90%, preferably at least 95%, most preferred at least 99%, of a surface of the cover.

Embodiment 15: The optical sensor according to any one of the preceding embodiments, wherein the cover is or comprises an atomic deposition coating or a chemical vapor deposition coating.

Embodiment 16: The optical sensor according to any one of the preceding embodiments, wherein the cover additionally exhibits a further functionality selected from at least one of: scratch-resistance, hydrophilicity, hydrophobicity, self-cleaning, anti-fog, and electrical conductivity.

Embodiment 17: The optical sensor according to any one of the preceding embodiments, wherein the cover is further at least partially coated with at least one additional layer and/or wherein the at least one additional layer is at least partially deposited between the layer of the photoconductive material and the cover.

Embodiment 18: The optical sensor according to the preceding embodiment, wherein the additional layer is or comprises at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

Embodiment 19: The optical sensor according to any one of the preceding embodiments, wherein the photoconductive material comprises an inorganic photoconductive material.

Embodiment 20: The optical sensor according to the preceding embodiment, wherein the inorganic photoconductive material comprises one or more of selenium, tellurium, a selenium-tellurium alloy, a photoconductive metal oxide, a group IV element or compound, a III-V compound, a II-VI compound, a chalcogenide, a pnictogenide, a halide, and solid solutions and/or doped variants thereof.

Embodiment 21: The optical sensor according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 22: The optical sensor according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 23: The optical sensor according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 24: The optical sensor according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 25: The optical sensor according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), cadmium zinc selenide (CdZnSe), a copper-zinc-tin sulfur-selenium chalcogenide (CZTSSe), and solid solutions and/or doped variants thereof.

Embodiment 26: The optical sensor according to any one of the five preceding embodiments, wherein the photoconductive metal oxide is selected from a group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), and solid solutions and/or doped variants thereof.

Embodiment 27: The optical sensor according to any one of the six preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe), and solid solutions and/or doped variants thereof.

Embodiment 28: The optical sensor according to any one of the seven preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 29: The optical sensor according to any one of the eight preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 30: The optical sensor according to any one of the preceding embodiments, wherein the cover at least partially covers the electrical contacts.

Embodiment 31: The optical sensor according to the preceding embodiment, wherein the electrical contacts are bondable, preferably by using wires, in particular Au, Al, or Cu wires.

Embodiment 32: The optical sensor according to any one of the preceding embodiment, the electrical contacts are bondable through the cover.

Embodiment 33: The optical sensor according to any one of the preceding embodiments, wherein the at least two electrical contacts are applied at different locations of the layer of the photoconductive material.

Embodiment 34: The optical sensor according to any one of the preceding embodiments, wherein the electrical contacts comprise at least one electrode material selected from the group consisting of Ag, Pt, Mo, Al, Au, and graphene.

Embodiment 35: The optical sensor according to the preceding embodiment, wherein an adhesive layer is provided at the electrical contacts, wherein the adhesive layer is adapted for bonding.

Embodiment 36: The optical sensor according to the preceding embodiment, wherein the adhesive layer comprises at least one of Ni, Cr, Ti or Pd.

Embodiment 37: The optical sensor according to any one of the preceding embodiments, wherein the substrate has a thickness of 10 μm to 1000 μm, preferably of 50 μm to 500 μm, more preferred of 100 μm to 250 μm.

Embodiment 38: The optical sensor according to any one of the preceding embodiments, wherein at least one of the cover and the substrate is optically transparent within a wavelength range.

Embodiment 39: The optical sensor according to any one of the two preceding embodiments, wherein the substrate is an electrically insulating substrate.

Embodiment 40: The optical sensor according to any one of the three preceding embodiments, wherein the substrate comprises one of glass, Si, a transparent conducting oxide (TCO), or a transparent organic polymer, wherein the transparent conducting oxide, preferably, comprises indium tin oxide (ITO), fluorine doped tin oxide (SnO2:F; FTO), aluminum doped zinc oxide (AZO), magnesium oxide (MgO), or a perovskite transparent conducting oxide.

Embodiment 41: The optical sensor according to any one of the four preceding embodiments, wherein the substrate is or comprises an electrically conducting substrate, wherein an additional insulating interlayer is present between the electrically conducting substrate and the at least one layer of the photoconductive material.

Embodiment 42: The optical sensor according to any one of the preceding embodiments, wherein the substrate is directly or indirectly applied to a circuit carrier device.

Embodiment 43: The optical sensor according to the preceding embodiment, wherein the substrate is glued to the circuit carrier device.

Embodiment 44: The optical sensor according to any one of the two preceding embodiments, wherein the substrate is attached to the circuit carrier device via a thin film of glue placed between adjacent surfaces of the substrate and of the circuit carrier device.

Embodiment 45: The optical sensor according to any one of the three preceding embodiments, wherein the circuit carrier device is a printed circuit board.

Embodiment 46: A detector for an optical detection of at least one object, comprising:
- at least one optical sensor according to any one of the preceding embodiments, the optical sensor comprising at least one sensor region, wherein the optical sensor is designed to generate at least one sensor signal in a manner dependent on an illumination of the sensor region by a light beam; and
- at least one evaluation device, wherein the evaluation device is designed to generate at least one item of information with respect to optical radiation provided by the light beam by evaluating the sensor signal of the optical sensor.

Embodiment 47: The detector according to the preceding embodiment, wherein the detector is adapted to generate the sensor signal by one or more of measuring an electrical resistance or a conductivity of at least one part of the sensor region.

Embodiment 48: The detector according to the preceding embodiment, wherein the detector is adapted to generate the sensor signal by performing at least one current-voltage measurement and/or at least one voltage-current-measurement.

Embodiment 49: The detector according to any one of the preceding embodiments relating to a detector, furthermore comprising at least one illumination source.

Embodiment 50: The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 51: The detector according to the preceding embodiment, wherein the light beam is generated by a reflection of the primary radiation on the object and/or by light emission by the object itself, stimulated by the primary radiation.

Embodiment 52: The detector according to the preceding embodiment, wherein the spectral sensitivity of the optical sensor is covered by the spectral range of the illumination source.

Embodiment 53: The detector according to any one of the preceding embodiments relating to a detector, wherein the detector further comprises at least one transfer device, the transfer device being adapted to guide the light beam onto the optical sensor.

Embodiment 54: A method for manufacturing an optical sensor, the method comprising the following steps:
- a) providing a substrate, a layer of at least one photoconductive material which is directly or indirectly applied to the substrate, and at least two individual electrical contacts contacting the layer of the photoconductive material; and
- b) thereafter, depositing an amorphous cover on accessible surfaces of the layer of the photoconductive material and of the substrate, wherein the cover comprises at least one metal-containing compound.

Embodiment 55: The method according to the preceding embodiment, wherein the layer of the photoconductive material comprises at least two individual sensor areas which are directly or indirectly applied to the same substrate, wherein the individual sensor areas are separated from each other between step a) and step b).

Embodiment 56: The method according to the preceding embodiment, wherein the individual sensor areas are separated from each other between step a) and step b) in a manner that each of the individual sensor areas is carried by a respective portion of the substrate.

Embodiment 57: The method according to any one of the preceding embodiments referring to a method, wherein the metal-containing comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Si, Ge, As, Sb, and Te.

Embodiment 58: The method according to the preceding embodiment, wherein the metal for the metal-containing compound is selected from the group consisting of Al, Ti, Ta, Mn, Mo, Zr, Hf, and W.

Embodiment 59: The method according to any one of the preceding embodiments referring to a method, wherein the at least one metal-containing compound is selected from the group comprising an oxide, a hydroxide, a chalcogenide, a pnictide, a carbide, or a combination thereof.

Embodiment 60: The method according to the preceding embodiment, wherein the at least one metal-containing compound is selected from at least one oxide, at least one hydroxide, or a combination thereof of Al, Ti, Zr or Hf; or from a nitride of Si.

Embodiment 61: The method according to any one of the preceding embodiments referring to a method, wherein step b) is repeated at least once.

Embodiment 62: The method according to the preceding embodiment, wherein at least two adjacent portions are deposited as a laminate, wherein the adjacent portions are selected to differ with respect to their respective composition, wherein at least one of the adjacent portions comprises the at least one metal-containing compound.

Embodiment 63: The method according to the preceding embodiment, wherein at least one of the adjacent portions is selected to comprise at least one of a metallic compound, a polymeric compound, a silicone compound, a glass compound.

Embodiment 64: The method according to any one of the preceding embodiments referring to a method, wherein the cover is deposited until it accomplishes a thickness of 10 nm to 600 nm, preferably of 20 nm to 200 nm, more preferred of 40 nm to 120 nm, most preferred of 50 to 95 nm.

Embodiment 65: The method according to any one of the preceding embodiments referring to a method, wherein the cover is deposited on the top and sides of the layer of the photoconductive material and at least the sides of the substrate in a manner that it is a conformal cover with respect to an adjacent surface of the photoconductive material and of the substrate.

Embodiment 66: The method according to the preceding embodiment, wherein the thickness of the conformal cover follows a corresponding surface of the photoconductive material and of the substrate within a deviation of ±50 nm, preferably of ±20 nm, mostly preferred of ±10 nm, over at least 90%, preferably at least 95%, most preferred at least 99%, of a surface of the cover.

Embodiment 67: The method according to any one of the preceding embodiments referring to a method, wherein at least one deposition method is used for depositing the metal-containing compound, wherein the at least one deposition method is, preferably, selected from an atomic layer deposition process, a chemical vapor deposition process, a sputtering process, or a combination thereof, preferably the atomic layer deposition process and the combination of the atomic layer deposition process and the sputtering process.

Embodiment 68: The method according to any one of the preceding embodiments referring to a method, wherein at least one additional layer is deposited on the cover or a partition thereof and/or wherein the at least one additional layer is at least partially deposited on the layer of the photoconductive material and, subsequently, covered by the cover.

Embodiment 69: The method according to the preceding embodiment, wherein the additional layer is selected to be or comprise at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

Embodiment 70: The method according to any one of the preceding embodiments referring to a method, wherein step b) is performed in a vacuum chamber.

Embodiment 71: The method according to the preceding embodiment, wherein the electrical contacts are provided before step b), wherein the cover is further partially deposited on the electrical contacts.

Embodiment 72: The method according to the preceding embodiment, wherein the electrical contacts are bonded to at least one external connection by using electrically conductive leads, preferably in form of wires, in particular Au, Al, or Cu wires.

Embodiment 73: The method according to the preceding embodiment, wherein the electrically conductive leads are bonded to the electrical contacts through the cover.

Embodiment 74: The use of a detector according to any one of the preceding claims referring to a detector, for a purpose of use, selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a security application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 3:
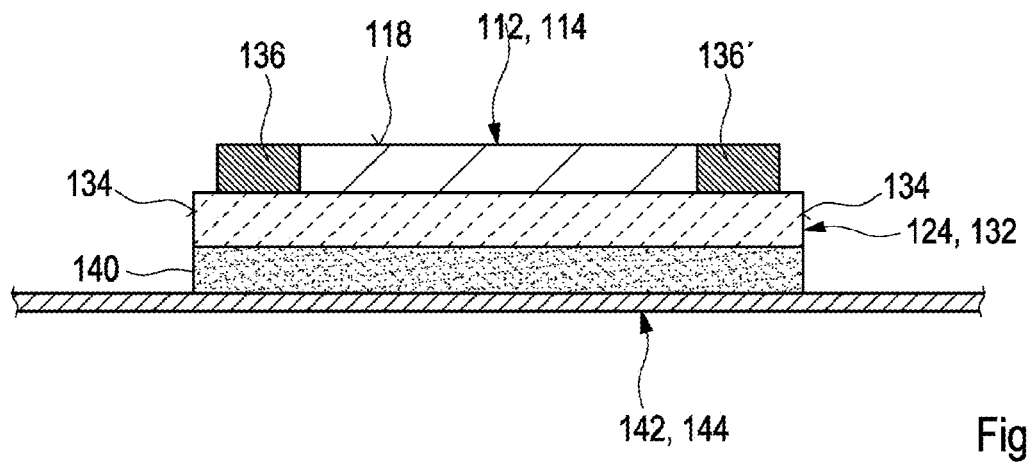
FIGS. 3A to 3C shows an exemplary embodiment of a method for manufacturing an optical sensor according to the present invention.
Figure 3:
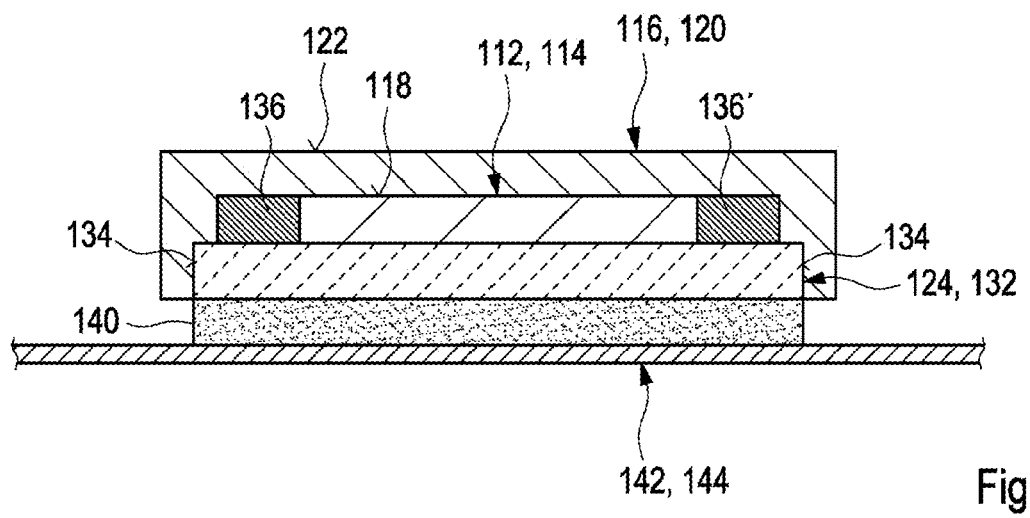
Figure 3:
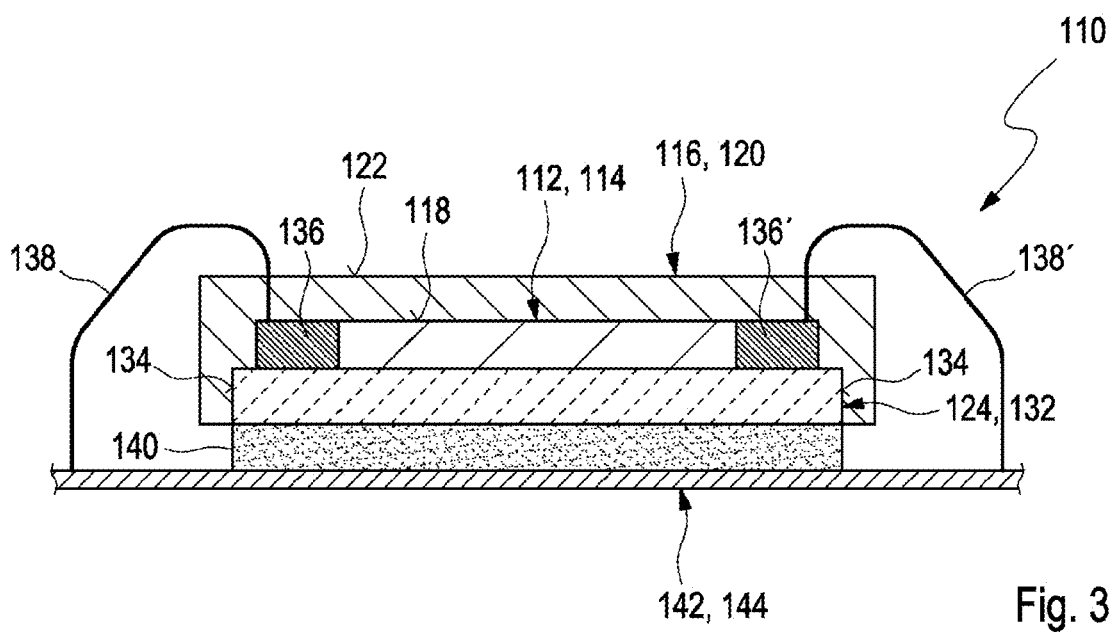

FIGS. 1A and 1B each illustrate, in a highly schematic fashion, an exemplary embodiment of an optical sensor 110 according to the present invention in a side view. Accordingly, the optical sensor 110 comprises a layer 112 of at least one photoconductive material 114. In particular, the layer 112 of the photoconductive material 114 may exhibit a thickness of 10 nm to 100 µm, preferably of 100 nm to 10 µm, more preferred of 300 nm to 5 µm. In a preferred embodiment, the layer 112 of the photoconductive material 114 may comprise an essentially flat surface, wherein, however, other embodiments which may exhibit variations of the surface of the layer 112, such as gradients or steps, may also be feasible. Herein, the layer 112 of the photoconductive material 114 may, preferably, be manufactured as described below with respect to FIG. 3. However, other manufacturing methods may also be feasible.

Figure 1:
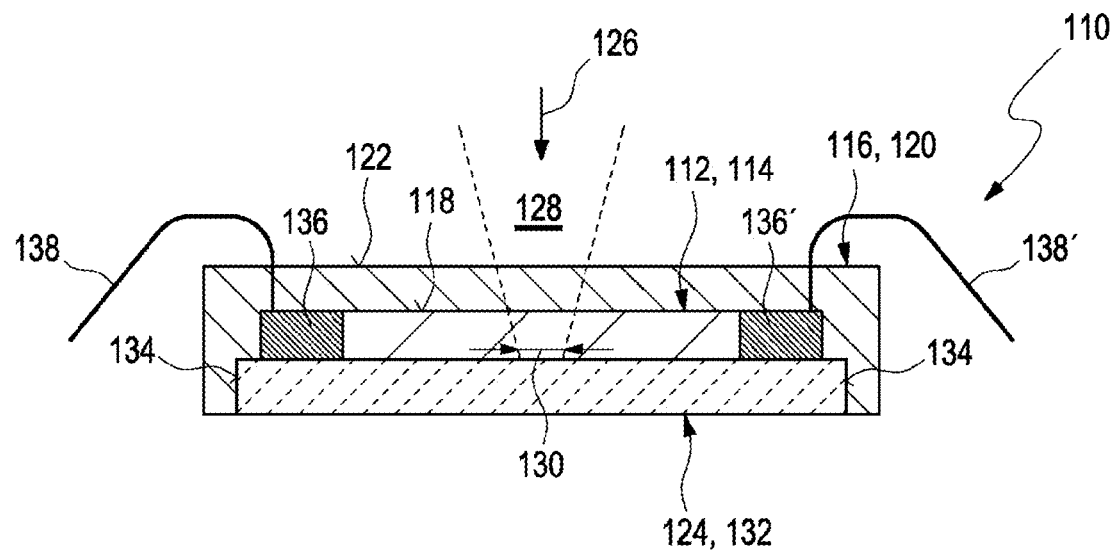
FIGS. 1A and 1B show preferred exemplary embodiments of an optical sensor according to the present invention.
Figure 1:
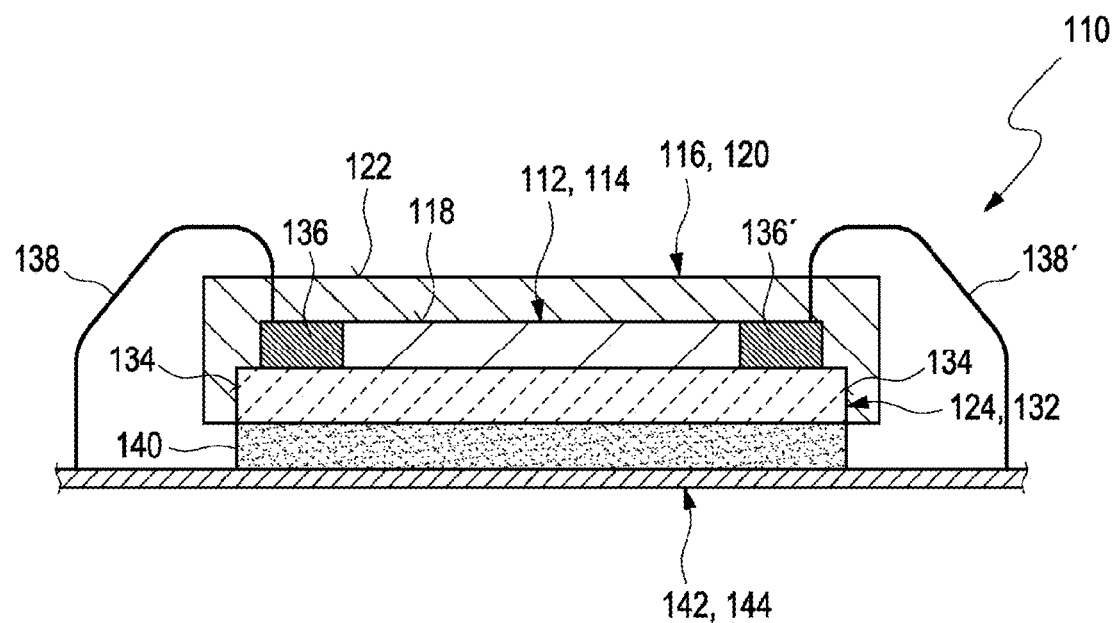

In the exemplary embodiments of FIG. 1, the photoconductive material 114 may be or comprise at least one chalcogenide which can, preferably, be selected from a group comprising sulfide chalcogenides, selenide chalcogenides, telluride chalcogenides, and ternary chalcogenides. In particular, the photoconductive material 114 may be or comprise a sulfide, preferably lead sulfide (PbS), a selenide, preferably lead selenide (PbSe), or a ternary chalcogenide, preferably lead sulfoselenide (PbSSe). Since many of the preferred photoconductive materials 114 are, generally, known to exhibit a distinctive absorption characteristic within the infrared spectral range, the optical sensor 110 may, preferably, be used as an infrared sensor. However, other embodiments and/or other photoconductive materials, in particular, the photoconductive materials as described elsewhere in this document for the present purpose, may also be feasible.

Further, the optical sensor 110 according to the present invention comprises a cover 116, wherein the cover 116, preferably fully, covers an accessible surface 118 of the photoconductive material 114. As already described above, the cover 116 may, thus, be adapted for providing an encapsulation for the photoconductive material 114, in particular, as an hermetic package, in order to avoid a degradation of the optical sensor 110 or a partition thereof, in particular of the photoconductive material 114, by external influence, such as humidity and/or oxygen. As mentioned above, the cover 116 is an amorphous cover comprising at least one metal-containing compound 120. In a particularly preferred embodiment as described here, the metal-containing compound 120 may comprise a metal selected from the group consisting of Al, Zr, Hf, Ti, Ta, Mn, Mo, and W, wherein the metals Al, Ti, Zr, and Hf are especially preferred. However, other kinds of metals, in particular the metals as indicated elsewhere for this purpose in this document, may also be feasible. Further, the metal-containing compound 120 may be selected from a group comprising an oxide, a hydroxide, a chalcogenide, a pnictide, a carbide, or a combination thereof.

In this particular embodiment, the metal-containing compound 120 may, preferably, comprise at least one oxide of Al, at least one hydroxide of Al, or a combination thereof, which may also be expressed by the formula $AlO_x(OH)_y$ with 0≤x≤1.5 and 0≤y≤1.5, wherein x+y=1.5. In this particular embodiment, the cover 116 may exhibit a thickness of 10 nm to 600 nm, preferably of 20 nm to 200 nm, more preferred of 40 nm to 120 nm, most preferred of 50 to 95 nm. This range of thickness may, in particular, reflect the amount of metal-containing compounds 120 within the cover 116 that may be advantageous to achieve the above-mentioned functions of providing encapsulation for the photoconductive material 114.

Further in this particular embodiment, the cover 116 may be a conformal cover with respect to the adjacent surface 118 of the photoconductive material 114. As defined above, the thickness of the conformal cover may, thus, follow the corresponding surface 118 of the photoconductive material 114 within a deviation of ±50 nm, preferably of ±20 nm, mostly preferred of ±10 nm, wherein the deviation may occur for at least 90%, preferably for at least 95%, mostly preferred for at least 99%, of a surface 122 of the cover 116, hereby leaving aside any contamination or imperfection that may be present on the surface 122 of the cover 116.

Alternatively, the metal-containing compound 120 may comprise at least one oxide of Zr, at least one hydroxide of Zr, or a combination thereof, which may also be expressed by the formula $ZrO_x(OH)_y$ with 0≤x≤2 and 0≤y≤2, wherein x+y=2. However, other kinds of metal-containing compounds 120, in particular of Hf, may also be feasible. In all cases, rests of unreacted organic ligands could, additionally, be present.

As further illustrated in each of FIGS. 1A and 1B, the at least one layer of the photoconductive material 114 is, preferably directly, applied to at least one substrate 124, wherein the substrate 124 may, preferentially, be or comprise an insulating substrate. Herein, the thickness of the substrate 124 may be of 10 μm to 2000 μm, preferably of 50 μm to 1000 μm, more preferred of 100 μm to 500 μm. In order to allow an incident light beam 126 to reach the photoconductive material 114 in order to optically modify an electrical conductivity within the layer 112 of the photoconductive material 114, at least one of the cover 116 and the substrate 124 is optically transparent within a desired wavelength range, such as in the infrared spectral range or a partition thereof.

As schematically depicted in FIG. 1A, a beam path 128 of an incident light beam 126 may be configured to pass through the cover 116 in order to generate a light spot having a diameter 130 within the layer 112 of the photoconductive material 114. As a result, it may, particularly, be advantageous to select the metal-containing compound 120 for the cover 116 to be, preferably, optically transparent within the desired wavelength range, in particular, by exhibiting a suitable absorption characteristic. Alternatively (not depicted here), it may, however, be preferred to select the metal-containing compound 120 for the cover 116 not to be optically transparent within the desired wavelength range. Such a kind of selection may, in particular, be advantageous in a case in which a specific metal-containing compound 120 may exhibit particularly preferred properties for the optical sensor 110 apart from offering optical transparency within the desired wavelength range. In addition, it may be preferred that one or both the metal-containing compound 120 used for the cover 116 and the material applied for the substrate 124 may exhibit optically transparent properties within the desired wavelength range, such as for allowing a sensing of the light beam 126 from both directions of the optical sensor 110. Herein, the substrate 124 may comprise an optically transparent material 132, in particular a glass. However, other materials that may be at least partially optically transparent in the infrared spectral range may also be feasible.

In contrast to optical sensors which are known from prior art, especially from WO 2018/019921 A1, the cover 116 not only covers the accessible surface 118 of the photoconductive material 114 apart from an area at which the cover 116 meets the substrate 124 where the preferably conformal cover 116 necessarily touches the substrate 124 at a negligible part of its surface but also an accessible surface 134 of the substrate 124. Preferably, the cover 116 may be applied in a manner that it may fully contact all accessible surfaces 118, 134 of the photoconductive material 114 and of the substrate 124, respectively. In particular, the cover 116 may be applied in a manner that it may directly contact a top and sides of the layer 112 of the photoconductive material 114 and at least the sides of the substrate 124. However, other kinds for providing an encapsulation for the photoconductive material 114, in particular, as hermetic package may also be feasible. As a result, the cover 116 may, thus, prevent a direct contact between the layer 112 of the photoconductive material 114 or of the substrate 124 with a surrounding atmosphere, thereby avoiding a degradation of the photoconductive material 114 by external influence, such as humidity and/or oxygen.

Compared to the cover layer as disclosed in WO 2018/019921 A1 which is only deposited on the layer of the photoconductive material, the cover 116 according to the present invention significantly improves the long-term stability of the optical sensor 110. As can be derived from a comparison of the following Tables 1 and 2, this effect can be experimentally verified. For this purpose, values of a dark resistance in MΩ were measured and showed a difference with increasing duration of exposure of various samples of the optical sensor 110 to an ambient atmosphere (standard pressure) at 26° C. The dark resistance was measured by using a voltage divider circuit having 10 V/mm and linearly extrapolated to 50 V/mm. Herein, the layer 112 of the photoconductive material 114 in each of the samples comprised a chip of PbS having a 2×2 mm² active area.

As presented in Table 1, samples A1 to A7 comprised a cover layer according to the state of the art, in particular as disclosed in WO 2018/019921 A1:

TABLE 1

(state of the art)

| sample | dark resistance/MΩ | | | | | | |
|---|---|---|---|---|---|---|---|
| time/hours | 0 | 10 | 50 | 100 | 500 | 1000 | 1500 |
| A1 | 0.3 | 0.3 | 0.3 | 0.3 | 0.3 | 0.3 | 0.2 |
| A2 | 0.3 | 0.3 | 0.3 | 0.3 | 0.3 | 0.2 | 0.2 |
| A3 | 0.3 | 0.3 | 0.3 | 0.3 | 0.3 | 0.2 | 0.2 |
| A4 | 0.3 | 0.3 | 0.3 | 0.3 | 0.3 | 0.3 | 0.3 |
| A5 | 0.3 | 0.3 | 0.3 | 0.3 | 0.3 | 0.2 | 0.2 |
| A6 | 0.3 | 0.3 | 0.3 | 0.3 | 0.3 | 0.2 | 0.1 |
| A7 | 0.3 | 0.3 | 0.3 | 0.3 | 0.3 | 0.3 | 0.2 |

In contrast hereto, samples B1 to B7 as presented in Table 2 comprised a cover 116 according to the present invention:

TABLE 2

(present invention)

| sample | dark resistance/MΩ | | | | | | |
|---|---|---|---|---|---|---|---|
| time/hours | 0 | 10 | 50 | 100 | 500 | 1000 | 1500 |
| B1 | 0.3 | 0.3 | 0.3 | 0.3 | 0.3 | 0.3 | 0.3 |
| B2 | 0.3 | 0.3 | 0.3 | 0.3 | 0.3 | 0.3 | 0.3 |
| B3 | 0.3 | 0.3 | 0.3 | 0.3 | 0.3 | 0.3 | 0.3 |
| B4 | 0.3 | 0.3 | 0.3 | 0.3 | 0.3 | 0.3 | 0.3 |
| B5 | 0.3 | 0.3 | 0.3 | 0.3 | 0.3 | 0.3 | 0.3 |
| B6 | 0.3 | 0.3 | 0.3 | 0.3 | 0.3 | 0.3 | 0.3 |
| B7 | 0.3 | 0.3 | 0.3 | 0.3 | 0.3 | 0.3 | 0.3 |

While samples A1 to A7 which were prepared according to the state of the art started to show a decreased value for the dark current after 1000 to 1500 hours of exposure, samples B1 to B7 which were prepared according to the present invention did not show any decrease of the dark current within the same duration of exposure. As a result, the cover 116 according to the present invention improves a reduction or exclusion of external influences by additionally minimizing or diminishing an effect of humidity and/or oxygen onto the layer 112 of the photoconductive material 114, especially by blocking and/or obstructing paths that may be capable of transferring humidity and/or oxygen through or along the surface of the substrate 124 to the layer 112 of the photoconductive material 114.

As further illustrated in FIGS. 1A and 1B, the optical sensor 110 according to the present invention comprises at least two individual electrical contacts 136, 136', i.e. at least one first electrical contact 136 and at least one second electrical contact 136', wherein the electrical contacts 136, 136' are adapted to contact the layer 112 of the photoconductive material 114. For this purpose, the electrical contacts 136, 136' may be configured and arranged in a manner in order to be able to guide an electrical current via the first electrical contact 136 through the layer 112 of the photoconductive material 114 to the second electrical contact 136' or vice-versa, or to apply a voltage across the layer 112 of the photoconductive material 114 by using the first electrical contact 136 and the second electrical contact 136'. For both purposes, the first electrical contact 136 may be electrically isolated from the second electrical contact 136' while both the first electrical contact 136 and the second electrical contact 136' are in direct connection with the layer 112 of the photoconductive material 114. As further illustrated herein, the cover 116 may at least partially coat the electrical contacts 136, 136', which may, especially, be configured to be bondable, such as to one or more leads 138, 138' that may lead to an external circuit as depicted in FIG. 1B.

The direct connection between any one of the electrical contacts 136, 136' and the layer 112 of the photoconductive material 114 may be provided by any known process capable of providing electrical contacts, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances at the contact zones. In order to allow a sufficient electrical conductivity through the electrical contacts 136, 136' while, concurrently, providing an sufficient mechanical stability of the electrical contacts 136, 136', the electrical contacts 136, 136' may, preferably, comprise at least one electrode material selected from the group consisting of the metals Ag, Cu, Pt, Al, Mo or Au, an alloy comprising at least one of the mentioned metals, as well as graphene. However, other kinds of electrode materials may also be feasible.

As schematically depicted in FIG. 1B, the substrate 124 may be attached, preferably via a thin film 140 of glue, to a circuit carrier device 142, in particular to a printed circuit board (PCB) 144. For this purpose, wires, such as gold wires, beryllium-doped gold wires, aluminum wires, platinum wires, palladium wires, silver wires, or copper wires, may be used as the leads 138, 138' for bonding the electrical contacts 136, 136', such as contact pads (not depicted here) on the circuit carrier device 142. In the particularly preferred embodiment as illustrated in FIG. 1B, the electrical contacts 136, 136' may be bondable through the cover 116. This feature may, in particular, allow improving the encapsulation function of the cover 116 and, concurrently, providing stability to the electrical contacts 136, 136'.

Figure 2:
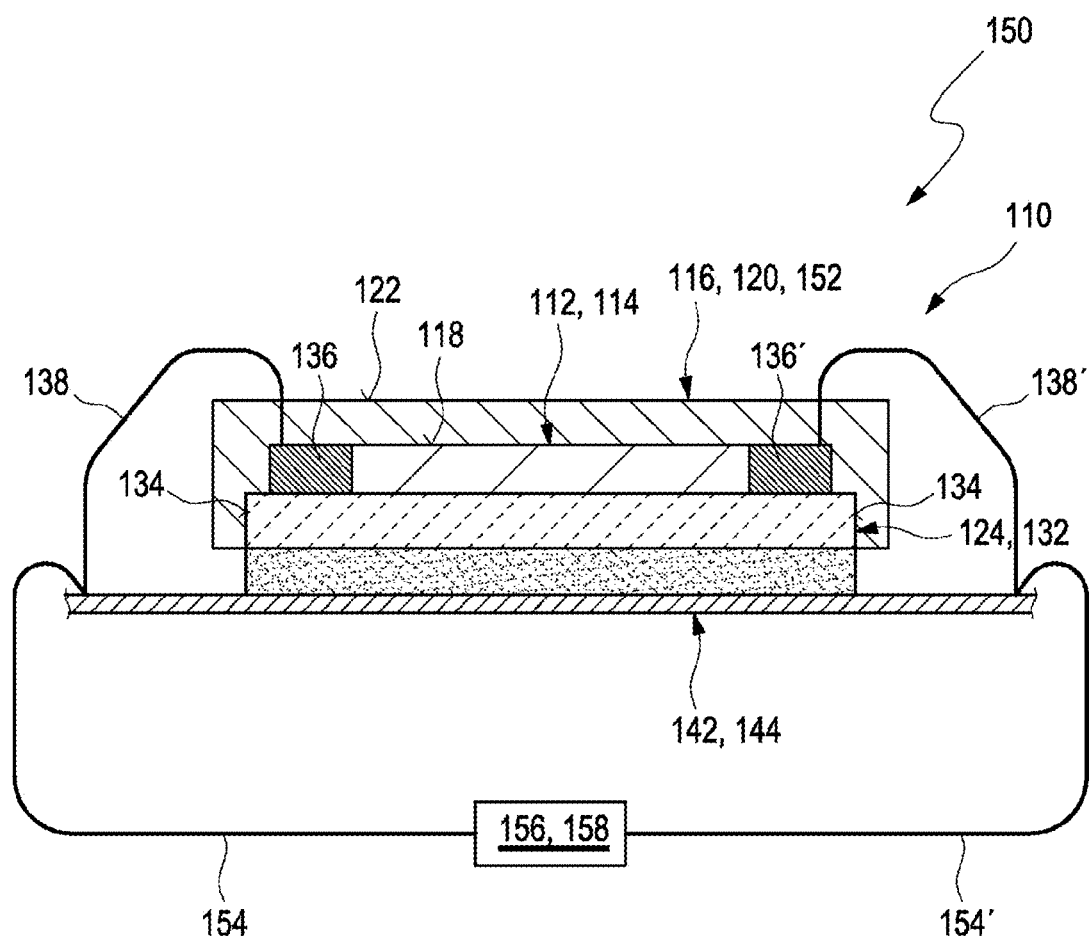
FIG. 2 shows a preferred exemplary embodiment of an optical detector according to the present invention.

FIG. 2 illustrates, in a highly schematic fashion, an exemplary embodiment of an optical detector 150 according to the present invention which may, preferably, be adapted for use as an infrared detector. However, other embodiments are feasible. The optical detector 150 comprises at least one of the optical sensors 100 as described above in more detail, which may be arranged along an optical axis of the detector 150. Specifically, the optical axis may be an axis of symmetry and/or rotation of the setup of the optical sensor 100. The optical sensor 100 may be located inside a housing of the detector 150. Further, at least one transfer device may be comprised, preferably a refractive lens. An opening in the housing, which may, particularly, be located concentrically with regard to the optical axis may, preferably, define a direction of view of the detector 150.

Further, the optical sensor 100 is designed to generate at least one sensor signal in a manner dependent on an illumination of a sensor region 152 by the light beam 126. Herein, the detector 150 may have a straight beam path or a tilted beam path, an angulated beam path, a branched beam path, a deflected or split beam path or other types of beam paths. Further, the light beam 126 may propagate along each beam path or partial beam path once or repeatedly, unidirectionally or bidirectionally.

According to the FiP effect, the optical sensor 100 may provide a sensor signal which, given the same total power of the illumination, is dependent on a beam cross-section 130 of the light beam 126 within the sensor region. However, other kinds of signals may also be feasible. As indicated above, the sensor region 152 comprises at least one of the layers 112 of the photoconductive material 114, preferably, a chalcogenide, in particular lead sulfide (PbS), lead selenide (PbSe), or lead sulfoselenide (PbSSe). However, other photoconductive materials 114, in particular other chalcogenides, may be used. As a result of the use of the photoconductive material 114 in the sensor region 152, an electrical conductivity of the sensor region 152, given the same total power of the illumination, depends on the beam cross-section of the light beam 126 in the sensor region 152. Consequently, the resulting sensor signal as provided by the optical sensor 110 upon impingement by the light beam 126 may depend on the electrical conductivity of the photoconductive material 114 in the sensor region 152 and, thus, allows determining the beam cross-section 130 of the light beam 126 in the sensor region 152.

Via further electrical leads 154, 154' to which the leads 138, 138' are bonded, the sensor signal may be transmitted to an evaluation device 156, which is, generally, designed to generate at least one item of information by evaluating the sensor signal of the optical sensor 110. For this purpose, the evaluation device 156 may comprise one or more electronic devices and/or one or more software components, in order to evaluate the sensor signals. Generally, the evaluation device 156 may be part of a data processing device 158 and/or may comprise one or more data processing devices 158. The evaluation device 156 may be fully or partially integrated into the housing and/or may fully or partially be embodied as a separate device which is electrically connected in a wireless or wire-bound fashion to the optical sensor 100. The evaluation device 156 may further comprise one or more additional components, such as one or more electronic hardware components and/or one or more software components, such as one or more measurement units and/or one or more evaluation units and/or one or more controlling units (not depicted here).

FIGS. 3A to 3C illustrates, in a highly schematic fashion, an exemplary embodiment of a method for manufacturing the optical sensor 110 according to the present invention.

As illustrated in FIG. 3A, prior to providing the layer 112 of the photoconductive material 114, the electrical contacts 136, 136' may be generated, such as in form of an evaporated metal layer which can be provided by known evaporation techniques on the substrate 124, preferably, comprising glass as the optically transparent material 132. In particular, the evaporated metal layer may comprise one or more of Ag, Al, Pt, Mg, Cr, Ti, or Au. Alternatively, the electrical contacts 136, 136' may comprise a layer of graphene. However, as mentioned above in more detail, other methods of generating the electrical contacts 136, 136' may also be feasible.

As further illustrated in FIG. 3A, the layer 112 of the photoconductive material 114 is, subsequently, provided. For this purpose, the photoconductive material 114 may be synthesized according to the following procedure. Accordingly, 0.015 mol/L thiourea or substituted products thereof, 0.015 mol/L lead acetate, lead nitrate, or substituted products thereof, and 0.15 mol/L sodium hydroxide or substituted products thereof are dissolved in a reaction volume, whereby a clear solution is obtained at room temperature. As known from prior art, when the solutions mentioned above are intermixed in any order, lead sulfide (PbS) precipitates out of the solution at a temperature above 30° C., usually, in such a manner that an even and relatively smooth layer may be formed on side walls and at a bottom of a liquid-containing reactor or on the walls of any object located within therein.

However, when immediately prior to the actual precipitation of PbS from the intermixed precipitating solution, an aqueous solution of an agent capable of liberating relatively abundant quantities of nascent oxygen, preferably, of potassium persulfate, hydrogen peroxide, or sodium perborate, is added thereto, PbS precipitates therefrom in the usual manner but in an activated form being capable of direct use within a cell or of additional sensitization by aging or low-temperature baking. The precipitating solution and the activating agent are preferably mixed at a temperature above 35° C. and stirred for one to three hours, during which time deposition occurs. Herein, an amount of the persulfate ion, perborate ion, or nascent oxygen from the hydrogen peroxide, expressed in moles, added to the liquid solution for precipitating PbS may, preferably, be 0.01 to 0.5 of the theoretical amount of PbS in the bath, expressed in moles, wherein the theoretical amount of PbS is that amount which would be formed if there were a total conversion of the lead and sulfur precipitating compounds to lead sulfide.

After formation of the PbS layer, an ageing step in a climate chamber, preferably at a temperature of approx. 50° C. and a humidity above 70%, may optionally be performed, which appears to be beneficial for the photoconductive performance. Improved photoconductivity may be obtained when deposited and aged films are further processed by annealing, i.e. by heating in vacuum or air at a temperature of approx. 100° C. to 150° C. for 1 to 100 hours.

However, other kinds of providing the layer 112 of the photoconductive material 114 may also be feasible.

FIG. 3B schematically illustrates depositing the metal-containing compound 120 as an amorphous cover 116 on the accessible surfaces 118,134 of the layer 112 of the photoconductive material PbS 114 and of the substrate 124, in order to function, in particular, as an encapsulation layer. For this purpose, at least one precursor which is adapted to react to the metal-containing compound 120 can be applied. In this preferred embodiment, an atomic layer deposition (ALD) process or the combination of ALD and sputtering has been used as the deposition method. Alternatively, other deposition processes, such as a chemical vapor deposition (CVD) process, may, however, also be applied.

In a preferred embodiment of the present invention, the cover 116 comprises $Al_2O_3$ which has been generated via the ALD process or the combination of an ALD process and a sputtering process. Alternatively, laminates like $Al_2O_3/TiO_2/Al_2O_3/$ . . . or $Al_2O_3/ZrO_2/Al_2O_3/$ . . . may also be produced. In this particular embodiment, the ALD process has been performed applying the following process parameters:
first precursor: $H_2O$;
second precursor: $Al(CH_3)_3$ (trimethylaluminum, TMA);
temperature approx. 60° C.;
approx. 700 cycles.

As further depicted in FIG. 3B, the $Al_2O_3$-comprising cover 116 may be applied in accordance with the present invention in a fashion that it may be, concurrently, coat the accessible surface 118 of the photoconductive PbS layer 112, the electrical contacts 136, 136' which may contact the photoconductive PbS layer 112, and the accessible surface 134 of the substrate 124.

As illustrated in FIG. 3C, the two electrical contacts 136, 136' which electrically contact the layer 112 of the photoconductive material 114 may, preferably finally, be bonded to at least one external connection by electrically conductive leads 138, 138', such as gold wires, which may be provided here through the cover 116. However, as mentioned above, other ways for providing electrical contacts 136, 136' to the photoconductive PbS layer 112 may also be feasible, such as by providing the leads 138, 138' already prior to depositing the amorphous cover 116, i.e. in an intermediate process step between the process steps as illustrated in FIGS. 3A and 3B.

In a particularly preferred embodiment, the layer 112 of the photoconductive material 114 may comprise at least two individual sensor areas (not depicted here), preferably an array of individual sensor areas, which are directly or indirectly applied to the same substrate 124, which may also be denoted as a "common substrate", which may, thus, exhibit a considerably large area. In this particular embodiment, the individual sensor areas are, firstly directly or indirectly applied to the common substrate 124, wherein at least two individual electrical contacts 136, 136' are provided for contacting each of the individual sensor areas within the 112 layer of the photoconductive material 114. Thereafter, the individual sensor areas are separated from each other in a fashion that each of the individual sensor areas is carried by a respective portion of the substrate 124. Finally, the cover 116 is deposited on the accessible surfaces 118, 134 of each of the individual sensor areas and of the respective portion of the substrate 124.

LIST OF REFERENCE NUMBERS 110 sensor
112 layer of photoconductive material
114 photoconductive material
116 cover
118 accessible surface of the layer of the photoconductive material
120 metal-containing compound
122 surface of the cover
124 substrate
126 light beam
128 beam path
130 diameter of light beam; beam cross-section
132 optically transparent material
134 accessible surface of the substrate
136, 136' electrical contacts
138, 138' electrically connecting leads
140 thin film of glue
142 circuit carrier device
144 printed circuit board
150 optical detector
152 sensor region
154, 154' further electrical leads
156 evaluation device
158 processing device

The invention claimed is:

1. An optical sensor (110), comprising a substrate (124) attached to a circuit carrier device (142), a layer (112) of at least one photoconductive material (114) which is directly or indirectly applied to the substrate (124), at least two individual electrical contacts (136, 136') contacting the layer (112) of the photoconductive material (114), and a cover (116) covering accessible surfaces of the photoconductive material (114) and of the substrate (124), wherein the cover (116) is an amorphous cover which comprises at least one metal-containing compound (120), wherein at least one of the substrate (124) and the cover (116) is optically transparent within a wavelength range, wherein the cover (116) is a single conformal layer with respect to an adjacent surface (118) of the layer (112) of the photoconductive material (114) and of the substrate (124), and wherein the cover (116) fully covers the accessible surface of both the layer (112) of the photoconductive material (114) and of sides of the substrate (124), wherein the cover (116) is a continuous coating which continuously covers both the layer (112) of the photoconductive material (114) and the sides of the substrate (124).

2. The optical sensor (110) according to claim 1, wherein the at least one metal-containing compound (120) comprises a metal selected from the group consisting of Al, Ti, Ta, Mn, Mo, Zr, Hf and W.

3. The optical sensor (110) according to claim 1, wherein the at least one metal-containing compound (120) is selected from the group consisting of an oxide, a hydroxide, a chalcogenide, a pnictide, a carbide, and a combination thereof.

4. The optical sensor (110) according to claim 1, wherein the cover (116) is or comprises an atomic deposition coating.

5. The optical sensor (110) according to claim 1, wherein the cover (116) further covers the electrical contacts (136, 136') at least partially.

6. The optical sensor (110) according to claim 1, wherein the electrical contacts (136, 136') are bondable through the cover (116).

7. The optical sensor (110) according to claim 1, wherein the photoconductive material (114) comprises at least one chalcogenide, wherein the chalcogenide is selected from the group consisting of a sulfide chalcogenide, a selenide chalcogenide, a telluride chalcogenide, a ternary chalcogenide, a quaternary chalcogenide, a higher chalcogenide, and a solid solution and/or a doped variant thereof.

8. The optical sensor (110) according to claim 1, wherein the chalcogenide is selected from the group consisting of lead sulfide (PbS), lead selenide (PbSe), and a solid solution and/or a doped variant thereof.

9. A detector (150) for an optical detection, comprising:
at least one optical sensor (110) according to claim 1, the optical sensor (110) comprising at least one sensor region (152), wherein the optical sensor (110) is designed to generate at least one sensor signal in a manner dependent on an illumination of the sensor region (152) by a light beam (126); and
at least one evaluation device (156), wherein the evaluation device (156) is designed to generate at least one item of information with respect to optical radiation provided by the light beam (126) by evaluating the sensor signal of the optical sensor (110).

10. A method of using the detector (150) according to claim 9, the method comprising using the detector (150) for a purpose selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, and a security application.

11. A method for manufacturing an optical sensor (100), the method comprising the following steps:
a) providing a substrate (124) attached to a circuit carrier device (142), a layer (112) of at least one photoconductive material (114) which is directly or indirectly applied to the substrate (124), and at least two individual electrical contacts (136, 136') contacting the layer (112) of the photoconductive material (114); and
b) thereafter, depositing an amorphous cover (116) on accessible surfaces of the layer (112) of the photoconductive material (114) and of the substrate (124), wherein the cover (116) comprises at least one metal-containing compound (120),
wherein at least one of the substrate (124) and the cover (116) is optically transparent within a wavelength range, wherein the cover (116) is a single conformal layer with respect to an adjacent surface (118) of the layer (112) of the photoconductive material (114) and of the substrate (124), and wherein the cover (116) fully covers the accessible surface of both the layer (112) of the photoconductive material (114) and of sides of the substrate (124), wherein the cover (116) is a continuous coating which continuously covers both the layer (112) of the photoconductive material (114) and the sides of the substrate (124).

12. The method according to claim 11, wherein the layer (112) of the photoconductive material (114) comprises at least two individual sensor areas which are directly or indirectly applied to the same substrate (124), wherein the individual sensor areas are separated from each other between step a) and step b) in a manner that each of the individual sensor areas is carried by a respective portion of the substrate (124).

* * * * *